United States Patent [19]
Ochiai et al.

[11] Patent Number: 6,025,258
[45] Date of Patent: *Feb. 15, 2000

[54] METHOD FOR FABRICATING SOLDER BUMPS BY FORMING SOLDER BALLS WITH A SOLDER BALL FORMING MEMBER

[75] Inventors: Masayuki Ochiai; Hidefumi Ueda; Michio Sono; Ichiro Yamaguchi; Kazuhiko Mitobe; Koki Otake; Junichi Kasai; Nobuo Kamehara; Yasuo Yamagishi; Masataka Mizukoshi, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/516,284
[22] Filed: Aug. 17, 1995

Related U.S. Application Data

[63] Continuation-in-part of application No. 08/374,429, Jan. 19, 1995, abandoned.

[30] Foreign Application Priority Data

Jan. 20, 1994 [JP] Japan ................................. 6-004751
Jun. 13, 1995 [JP] Japan ................................. 7-145962

[51] Int. Cl.$^7$ ................................................. H01L 21/283
[52] U.S. Cl. ................................. 438/613; 228/180.22
[58] Field of Search ..................... 257/737, 738; 437/183; 228/18, 22; 438/613

[56] References Cited

U.S. PATENT DOCUMENTS

| | | | |
|---|---|---|---|
| 3,458,925 | 8/1969 | Napier et al. | 228/180.22 |
| 5,136,363 | 8/1992 | Endo et al. | 357/71 |
| 5,208,186 | 5/1993 | Mathew | 437/183 |
| 5,219,117 | 6/1993 | Lin . | |
| 5,381,848 | 1/1995 | Trabucco | 164/102 |
| 5,607,099 | 3/1997 | Yeh et al. | 228/180.22 |
| 5,643,831 | 7/1997 | Ochai et al. . | |

FOREIGN PATENT DOCUMENTS

| | | |
|---|---|---|
| 242 908 | 2/1987 | Germany . |
| 53-3980 | 2/1978 | Japan . |
| 62-25435 | 2/1987 | Japan . |
| 63-289824 | 11/1988 | Japan . |
| 1-308037 | 12/1989 | Japan . |
| 4-14834 | 1/1992 | Japan . |
| 4-263433 | 9/1992 | Japan . |
| 4-263434 | 9/1992 | Japan . |
| 4-264731 | 9/1992 | Japan . |
| 6-124953 | 5/1994 | Japan . |

*Primary Examiner*—David E. Graybill
*Attorney, Agent, or Firm*—Armstrong, Westerman, Hattori, McLeland and Naughton

[57] ABSTRACT

A method for fabricating solder bumps onto a semiconductor chip. A solder ball forming member having a flat surface and a plurality of cavities arranged on the flat surface in a predetermined pattern is prepared. The cavities are then filled with a solder paste, and the solder ball forming member is heated to a temperature higher than the melting point of the solder so that the molten solder powder in the solder paste form solder balls due to surface tension. The semiconductor chip is then moved toward the solder ball forming member to transfer the heated solder balls from the solder ball forming member to the semiconductor chip.

41 Claims, 19 Drawing Sheets

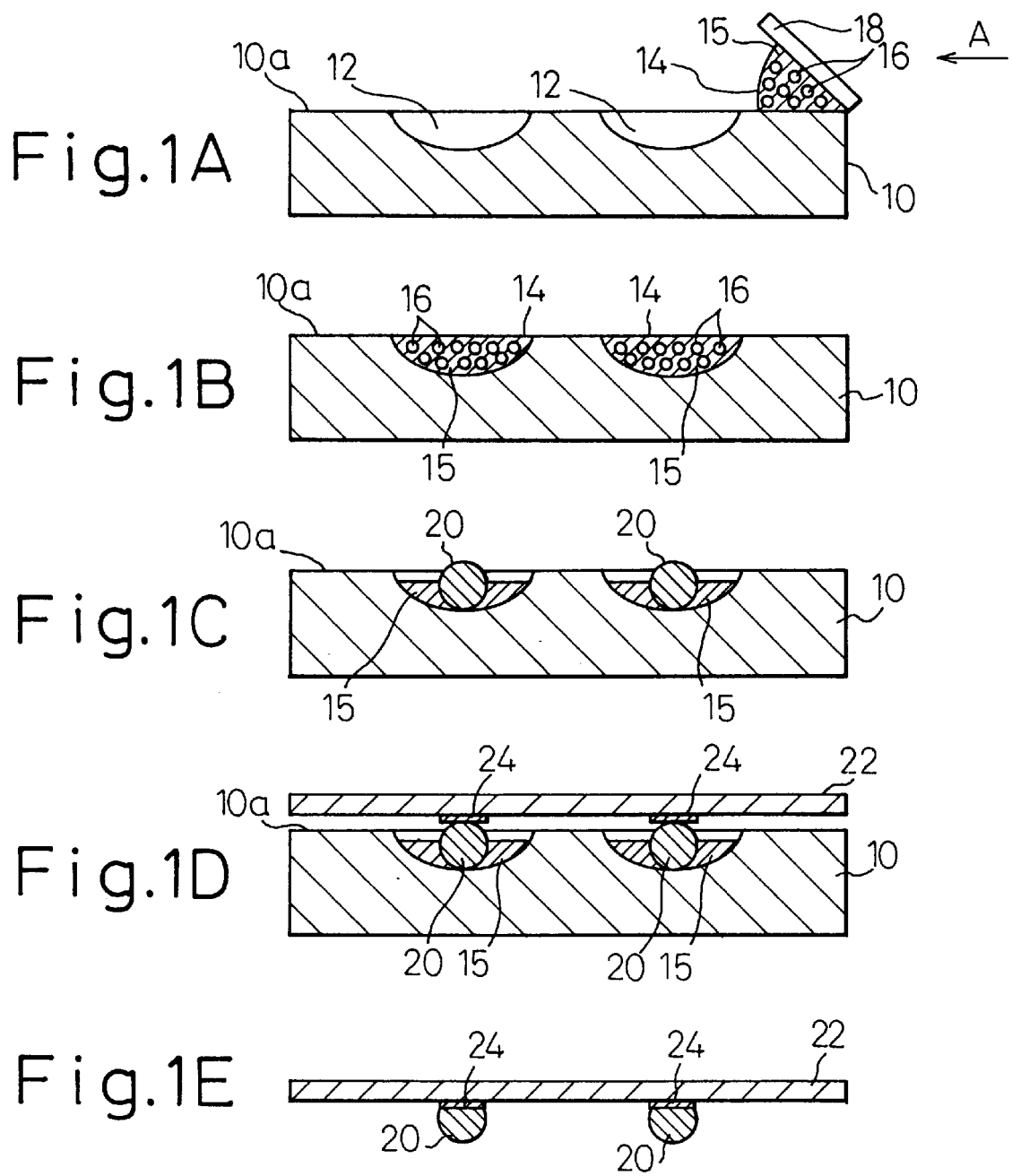

6,025,258

METHOD FOR FABRICATING SOLDER BUMPS BY FORMING SOLDER BALLS WITH A SOLDER BALL FORMING MEMBER

CROSS REFERENCE TO RELATED APPLICATION

This application is a Continuation-In-Part application of Ser. No. 08/374,429 filed on Jan. 19, 1995, abandoned.

BACKGROUND OF THE INVENTION

1. Field of the Invention

The present invention relates to a method for manufacturing a semiconductor chip, and in particular, to a method for efficiently fabricating solder bumps on, for example, electrode pads of a semiconductor chip. In particular, the present invention relates to a method for fabricating solder bumps by forming solder balls from a solder paste. The present invention also relates to a method for fabricating solder balls from a solder paste.

2. Description of the Related Art

Recent data processing apparatuses include many LSIs and VLSIs for dealing with a large volume of data at a very high speed. LSIs and VLSIs comprise semiconductor chips which include integrated electronic circuits and parts. In order to mount a semiconductor chip to, for example, a ceramic substrate, solder bumps are arranged onto one of the semiconductor chip and the ceramic substrate so that the semiconductor chip can be mechanically and electrically connected to the ceramic substrate by melting the solder bumps.

Conventionally, a solder paste is printed onto the ceramic substrate, and leads extending from the semiconductor chip are placed on the solder paste on the ceramic substrate. The ceramic substrate is then heated to cause the solder to melt so that the semiconductor chip can be mechanically and electrically connected to the ceramic substrate (For example, Japanese Examined Patent Publication (Kokoku) No. 53-3980). For printing the solder paste onto the ceramic substrate, a metal mask having predetermined openings is used, so that the solder paste is applied to the surface of the metal mask and a squeegee is moved along the surface of the metal mask to cause the solder paste pass through the openings in the metal mask.

Japanese Unexamined Patent Publication (Kokai) No. 6-124953 discloses a method for forming solder bumps with the use of a plate having a plurality of cavities. In this method, the cavities are filled with solder paste, and a semiconductor device having gold bumps is moved toward this plate so that the gold bumps are stuck in the solder paste in the cavities. The semiconductor device is then moved away from this plate, and the solder bumps in the form of solder paste are attached to the gold bumps of the semiconductor device.

However, as the electronic circuits on the semiconductor chip are highly integrated, the number of the leads acting as input and output terminals increases and the pitch between the leads is shortened. In this situation, the amount of the solder paste to be printed becomes smaller and the printing of the solder paste to be printed becomes smaller and the printing of the solder paste becomes difficult. That is, the solder paste comprises solder powder usually having the powder size of 30 to 50 $\mu$m and a flux including a resin, an activator, and an organic solvent, and the viscosity of the solder paste at the room temperature is relatively high, for example, in the order of 20 to $30 \times 10^4$ cp. Therefore, if the size of the openings of the metal mask is small, for example, is 100 $\mu$m, the solder paste may clog the openings of the metal mask and may not smoothly pass through the openings of the metal mask, with the result that the solder paste is not printed to the ceramic substrate.

In the recently introduced flip-chip structure, leads are not attached to the semiconductor chip, but solder bumps are arranged on the semiconductor chip so that the semiconductor chip can be directly mounted on the ceramic substrate. In this case too, as the size of the solder bumps has become smaller, the printing of the solder bumps has become difficult. Thus, methods for fabricating smaller solder bumps, which do not use a solder paste but use solder only, have been proposed. One is a vacuum vapor deposition method, and the other is a solder plating method.

A vacuum vapor deposition method is disclosed in, for example, Japanese Unexamined Patent Publication (Kokai) No. 4-014834. The solder is heated and vaporized in a vacuum environment, and the vaporized solder is deposited on an object. In the method disclosed in the above publication, a transfer plate made from a material such as quartz or glass having a good heat resisting property and a low wettability to the solder, and a metal mask having openings in a predetermined pattern are used. The transfer plate is placed above the metal mask so that the solder vapor which passes through the openings of the metal mask is deposited onto the transfer plate. Therefore, solder bumps are formed onto the transfer plate in the same pattern as that of the openings of the metal mask.

The heated semiconductor chip is then superposed on the transfer plate so that the solder bumps are transferred from the transfer plate to the semiconductor chip. In this way, solder bumps are formed on the semiconductor chip in the predetermined pattern. By this method, it is possible to form solder bumps with a high accuracy, but there is a problem that a long time is necessary for vaporizing the solder and forming solder bumps having a desired thickness, for example, several tens of $\mu$m.

In the solder plating method, the semiconductor chip is subjected to plating after the surface of the semiconductor chip is converted by a resist and openings are formed in the resist at positions where solder bumps are to be formed. In this method, however, the circuits in the LSI, for example, are affected by the plating solution and undergo a chemical change, resulting in a deterioration of the electrical characteristic or an undesirable composition change in the deposited solder.

In addition, the solder bumps are formed not only on the semiconductor chip but also on other members such as a ceramic substrate or a ceramic package. Also, solder bodies in the form of balls without solder paste are available for certain applications. It is possible to form solder bumps using these solder balls. However, there is no prior art by which the solder balls can be easily fabricated with a very small variation in size.

SUMMARY OF THE INVENTION

The object of the present invention is to provide a method for easily fabricating solder bumps having a desired size.

The other object of the present invention is to provide a method for fabricating solder balls by which solder balls having a desired size can be easily fabricated.

According to the present invention, there is provided a method for fabricating solder bumps, said method comprising the steps of: preparing a solder ball forming member having a flat surface and a plurality of cavities arranged on the flat surface in a predetermined pattern; filling the cavities with a solder paste including solder powder and a flux; heating the solder ball forming member to cause the solder powder contained in the solder paste in each of the cavities to melt and to form solder balls due to a surface tension; and relatively moving a first member, onto which solder bumps are to be formed, toward the solder ball forming member to transfer the heated solder balls from the solder ball forming member to the first member.

Using this method, the cavities of the solder ball forming member have substantially the same shape and the same volume, and accordingly, when the cavities is filled with the solder paste, the volumes of the solder paste in all the cavities are the same. Solder powder are uniformly distributed in the solder paste. After heating the solder ball forming member to a temperature higher than the melting point of the solder, the molten solder powder form balls due to surface tension and solder balls having substantially the same volume are formed in all the cavities. The formed solder balls are separated from the flux, and it is possible to take the solder balls out of the cavities. Therefore, by relatively moving the first member onto which solder bumps are to be formed toward the solder ball forming member, the heated solder balls are transferred from the solder ball forming member to the first member in a pattern identical to the pattern of the cavities. In this way, the solder bumps having the desired size, in accordance with the volume of the cavities of the solder ball forming member, are formed on the first member in predetermined positions.

Preferably, the first member onto which solder bumps are to be formed comprises one of a semiconductor chip (IC chip), a semiconductor package, a printed wiring board, and a TAB member (leads on a TAB tape).

At least a portion of the solder ball forming member including the flat surface is made from a material having a lower wettability with regard to the solder than that of a portion of the first member at which solder bumps are to be formed. The solder balls can then be easily transferred from the solder ball forming member to the first member.

Preferably, the step of filling the cavities of the solder ball forming member with a solder paste comprises applying a solder paste to the flat surface of the solder ball forming member and moving a squeegee along the flat surface of the solder ball forming member. By this, it is possible to fill the cavities with the solder paste in the easiest way and the volumes of the solder paste in all the cavities are the same.

Preferably, in one aspect of the transfer of the solder balls, the cavities of the solder ball forming member have such a shape that the solder ball formed in each of the cavities in the solder ball forming step partially project beyond the flat surface of the solder ball forming member. Therefore, by relatively moving the first member toward the flat surface of the solder ball forming member, the projecting solder balls are adhered to and transferred to the first member.

The transfer of the solder balls can be carried out while the solder balls are in the hot condition just after the solder balls are formed.

Alternatively, the step of cooling the solder ball forming member is included after the solder ball forming step and before the solder ball transferring step, and the solder ball forming step includes heating at least one of the solder ball forming member and the first member.

Preferably, the cavity of the solder ball forming member has an outline at the flat surface, a bottom, and a depth from the flat surface to the bottom, the size of the outline being larger than the size of the solder ball to be formed. By this, the shapes of the cavities of the solder ball forming member are determined so that the solder balls partially project beyond the flat surface of the solder ball forming member. This is an alternative way of saying that the depth of the cavity is smaller than the diameter of the solder ball to be formed.

Preferably, the outline of the cavity at the flat surface is substantially circular or polygonal.

Preferably, the cavity has a deepest point at a predetermined position, so that the solder ball is formed at a position corresponding to the deepest point. The diameter or width of the cavity becomes smaller as the depth increases, or the diameter or width of the cavity becomes stepwise smaller as the depth increases.

Preferably, the solder ball forming member comprises a single plate.

Alternatively, the solder ball forming member comprises a plurality of superposed plates, at least one of the superposed plates having through holes, each of the through holes forming a part of the cavity. By this, the shape of the cavities changes as the depth increases.

Preferably, in another aspect of the transfer of the solder balls, the cavity of the solder ball forming member has an outline at the flat surface, a bottom, and an annular side wall portion interconnecting the flat surface to the bottom, the solder ball forming member comprises first and second removably superposed plates, the first plate having a flat surface providing the flat surface of the solder ball forming member and through holes providing the annular side wall portion, the second plate forming the bottoms of the cavities of the solder ball forming member. The solder ball transferring step comprises the steps of moving the second plate away from the first plate with the solder balls retained in the first plate, and relatively moving the first member toward a second surface of the first plate opposite to the flat surface. In this way, it is possible to transfer the solder balls from the second surface of the solder ball forming member opposite to the flat surface.

In this case, the solder ball transferring step preferably further comprises pushing the solder balls retained in the first plate toward the first member.

The present invention also provides a method for fabricating solder balls, said method comprising the steps of: preparing a solder ball forming member having a flat surface and a plurality of cavities arranged on the flat surface in a predetermined pattern; filling the cavities with a solder paste comprising solder powder and a flux; heating the solder ball forming member to cause the solder powder contained in the solder paste in each of the cavities to form solder balls due to surface tension; cooling the solder ball forming member; and removing the solder balls from the cavities of the solder ball forming member.

In this method too, the cavities of the solder ball forming member have substantially the same shape and the same volume, and accordingly, when the cavities is filled with the solder paste, the volumes of the solder paste in all the cavities are the same. By heating the solder ball forming member, the molten solder powder flow together due to surface tension and solder balls having substantially the same volume are formed in all the cavities. The formed solder balls are separated from the flux. Then, the solder ball forming member is cooled so that solder balls become hard, and it is possible to take out the solder balls from the cavities. The flux will be attached to the solder balls but can be removed from the solder balls by washing.

BRIEF DESCRIPTION OF THE DRAWINGS

The other objects and features of the present invention will become more apparent from the following description of the preferred embodiments, with reference to the accompanying drawings in which:

FIGS. 1A to 1E are views illustrating a method for fabricating solder bumps according to the first embodiment of the present invention;

DESCRIPTION OF THE PREFERRED EMBODIMENTS

FIGS. 1A to 1E are views illustrating a method for fabricating solder bumps according to the first embodiment of the present invention. In the method of the present invention, a solder ball forming member 10 is first prepared, as shown in FIG. 1A. The solder ball forming member 10 is made from a stainless steel plate (for example, SUS 304) which has a good heat resisting property. The solder ball forming member 10 has a flat surface 10a and a plurality of identically shaped cavities 12 arranged on the flat surface 10a at the pitch of 300 μm in a predetermined matrix pattern. Each cavity 12 has a circular outline at the flat surface 10a with the diameter of 200 μm, a bottom, and a depth of 50 μm. The shape of the cavity 12 is such that the diameter becomes smaller as the depth increases. The cavities 12 can be formed by machining the flat surface 10a of the solder ball forming member 10.

The solder ball forming member 10 is preferably made from a material having a low wettability with regard to the solder, such as stainless steel, chrome, glass, ceramic or titan, or the solder ball forming member 10 is coated with a material having a low wettability with regard to the solder, such as chrome, titan or $SiO_2$. In the embodiment, the solder ball forming member 10 is plated with a black chrome (called BCR) after the cavities 12 are formed.

Figure 3:
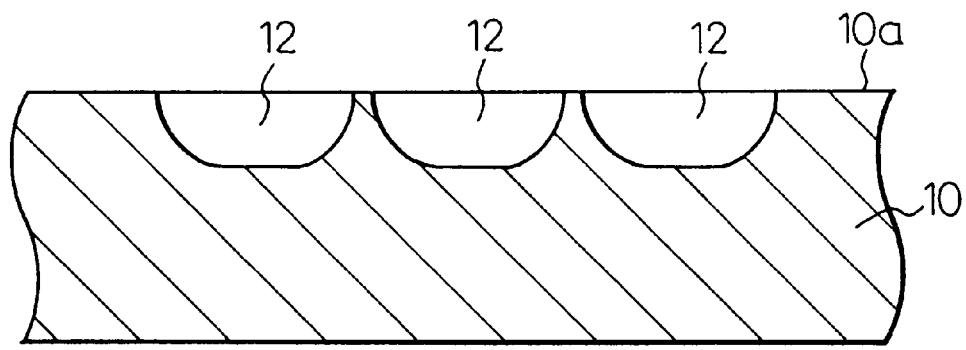
FIG. 3 is a cross-sectional view of another example of the solder ball forming member.
Figure 4:
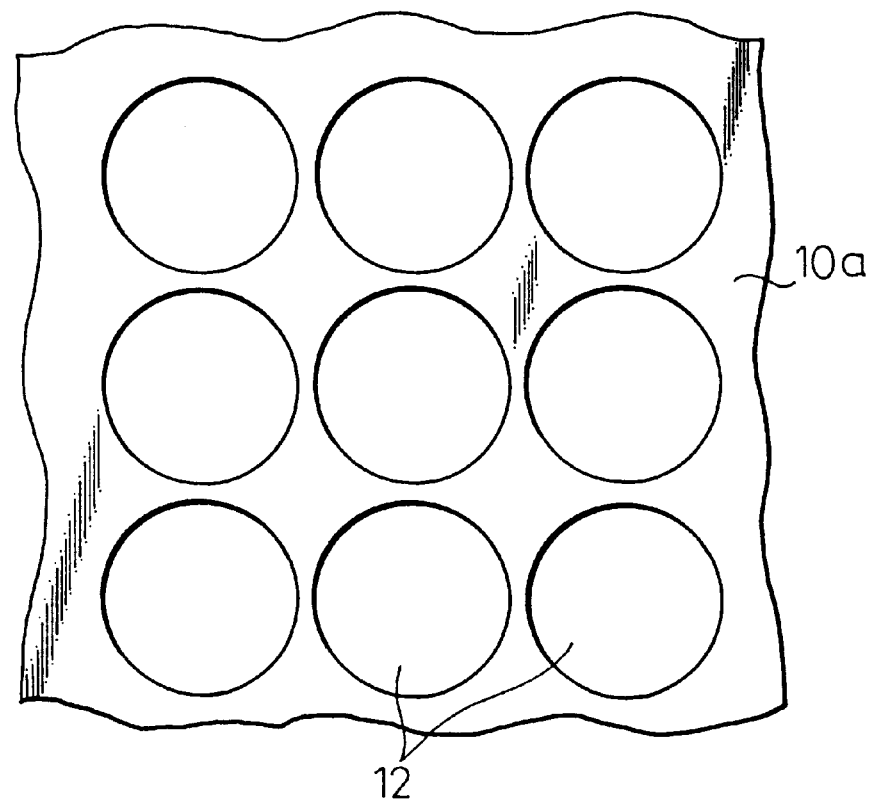
FIG. 4 is a plan view of the solder ball forming member of FIG. 3.

FIGS. 3 and 4 show another example of the solder ball forming member 10 having cavities 12 which are formed on the flat surface 10a by etching. In this example, a resist (not shown) is applied to the flat surface 10a of the solder ball forming member 10, and openings are formed in the resist in a predetermined pattern by exposing and developing. The solder ball forming member 10 is then etched, using a ferric chloride solution as an etchant. In FIG. 4, it will be found that the cavities 12 are arranged in a matrix pattern.

Figure 5:
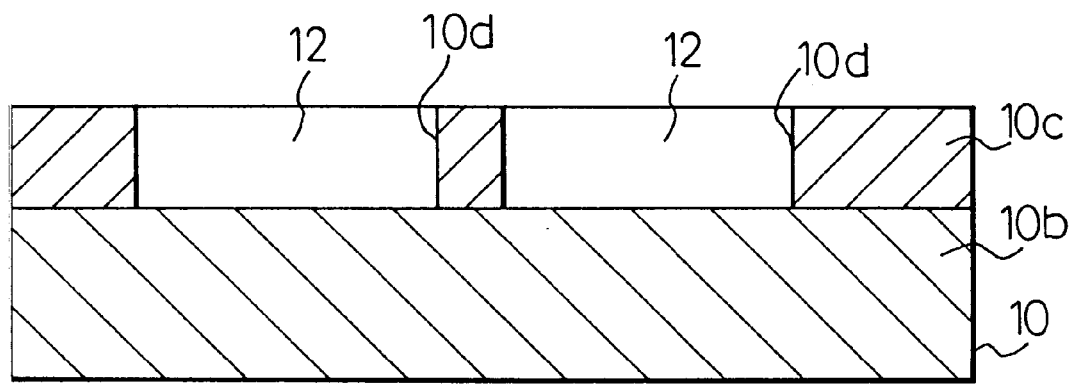
FIG. 5 is a cross-sectional view of a further example of the solder ball forming member.

FIG. 5 shows a further example of the solder ball forming member 10. The solder ball forming member 10 comprises a flat, relatively rigid stainless steel plate 10b and a stainless steel plate 10c having through holes 10d corresponding to the cavities 12, the plates 10b and 10c being superposed one on another.

Figure 6:
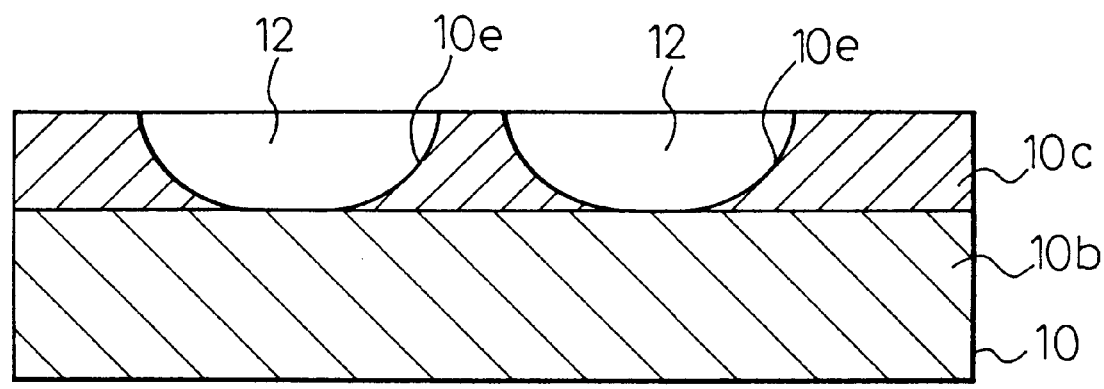
FIG. 6 is a cross-sectional view of a further example of the solder ball forming member.

FIG. 6 shows a further example of the solder ball forming member 10. The solder ball forming member 10 comprises a flat, relatively rigid stainless steel plate 10b and a stainless steel plate 10c having rounded through holes 10d corresponding to the cavities 12, the plates 10b and 10c being superposed one on another. In FIGS. 5 and 6, the thickness of the plate 10c corresponds to the depth of the cavities 12. By this feature, it is possible to ensure the depth of the cavities 12 of the solder ball forming member 10.

As shown in FIGS. 1A and 1B, the cavities 12 of the solder ball forming member 10 are then filled with a solder paste 14. To this end, the solder paste 14 is applied to the flat surface 10a of the solder ball forming member 10.

The solder paste 14 comprises solder powder 16 and a flux 15. The flux 15 includes a resin, an activator, and an organic solvent. The solder powder 16 is mixed in the flux 15 at a very high density so that the solder component is uniformly distributed in the solder paste 14. In order to arrange the solder powder 16 at a very high density, the solder powder 16 includes various powder size components. In the embodiment, for example, the solder powder 16 comprises approximately 60 percent of powder having the powder size smaller than 20 μm, approximately 35 percent of powder having the powder size smaller than 30 μm, and approximately 5 percent of powder having the powder size smaller than 40 μm. The content of the solder powder 16 in the solder paste 14 is approximately 90 percent by weight, and approximately 44 percent by volume. The solder comprises Pb-5Sn and the melting point is in the range from 300 to 314° C. It is, of course, possible to use a solder comprising another composition. For example, it is possible to use a solder including one of the elements of Sn, Pb, In, Bi, Ag, Zn, Au, Ge, Si, Sb.

Filling the cavities 12 with the solder paste 14 is carried out by moving a squeegee 18 along the flat surface 10a of the solder ball forming member 10 in the direction of the arrow A, for example. Since the cavities 12 of the solder ball forming member 10 have substantially the same volume, the volumes of the solder paste 14 in all the cavities 12 are substantially the same. Solder powder 16 is uniformly distributed in the solder paste 14, and the volumes of the solder powder 16 in the cavities 12 are substantially the same.

The solder ball forming member 10 is then heated to a temperature higher than the melting point of the solder, as shown in FIG. 1C. The solder powder 16 contained in the solder paste 14 is thus molten and flows together due to surface tension. Accordingly, a solder ball 20 is formed in each of the cavities 12. The flux 15 is separated from the solder ball 20. When the solder ball forming member 10 is heated, the solvent in the flux 15 may evaporate and the activator may be partially decomposed. It is also possible to carry out a preheat at a lower temperature to cause a partial evaporation of the solvent.

As shown in FIG. 1D, a first member 22 onto which solder bumps are to be formed is then relatively moved toward the solder ball forming member 10, so that the first member 22 abuts against the heated solder balls 20 and the heated solder balls 20 are transferred from the solder ball forming member 10 to the first member 22.

In this case, the solder balls 20 are transferred to the first member 22 without changing their positions in the solder ball forming member 10, i.e., in a pattern identical to the pattern of the cavities 12. In this way, it is possible to obtain the small solder balls 20 having a size smaller than, for example, 100 μm in exact positions.

In the embodiment, the first member 22 on which solder bumps are to be formed comprises a semiconductor chip in the form of an LSI or a VLSI and has electrode pads 24 connected to the circuits (not shown). The cavities 12 of the solder ball forming member 10 are arranged in the same pattern as the electrode pads 24 of the first member 22. That is, the electrode pads 24 are arranged on the silicon substrate at the pitch of 300 μm. The electrode pads 24 all have a diameter of 100 μm, for example. The electrode pads 24 comprise a two-layered structure comprising a gold layer having a thickness of 1,000 Å and a nickel layer having a thickness of 5,000 Å, so that the electrode pads 24 have a good soldering property.

The first member 22 onto which solder bumps are to be formed is exactly positioned relative to the solder ball forming member 10, so that the solder balls 20 are attached to the electrode pads 24. In this way, the solder balls 20 become solder bumps, as shown in FIG. 1E.

In the embodiment of FIGS. 1A to 1E, when the solder balls 20 are transferred, the first member 22 onto which solder bumps are to be formed is moved toward the flat surface 10a of the solder ball forming member 10. In order to realize the transfer of the solder balls 20, it is necessary that the solder balls 20 partially project beyond the flat surface 10a so that the first member 22 can directly contact the solder balls 20. This is attained by designing the shape of the cavities 12 in the following manner.

The content of the solder powder 16 in the solder paste 14 is approximately 44 percent by volume, as described above. Therefore, in order that the solder balls 20 partially project from the flat surface 10a, the cavities 12 must be shallow and the size of the outline of each cavity 12 at the flat surface is greater than the size of the solder ball 20 to be formed.

Figure 2A:
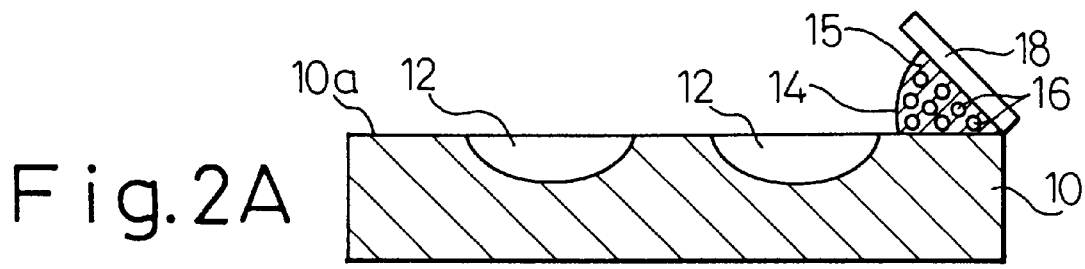
FIGS. 2A to 2F are views illustrating a method for fabricating solder bumps according to the second embodiment of the present invention.
Figure 2B:
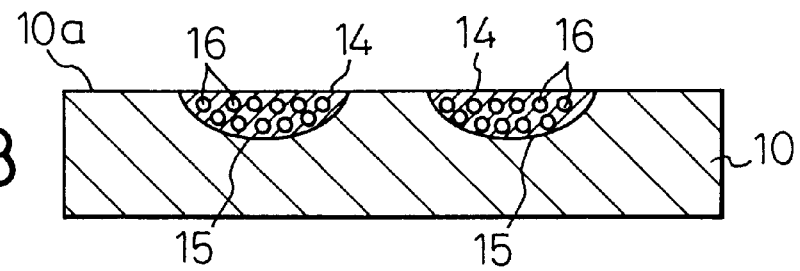
Figure 2C:
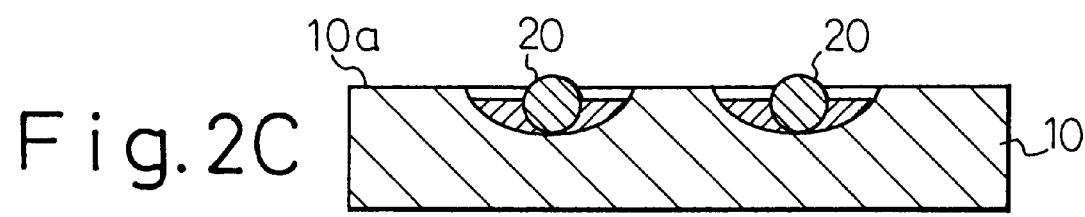

FIGS. 2A to 2F show the second embodiment of the present invention. Similarly to the first embodiment, a solder ball forming member 10 is prepared, the cavities 12 of the solder ball forming member 10 are then filled with a solder paste 14, and the solder ball forming member 10 is then heated to form solder balls 20, as shown in FIGS. 2A to 2C.

Figure 2D:
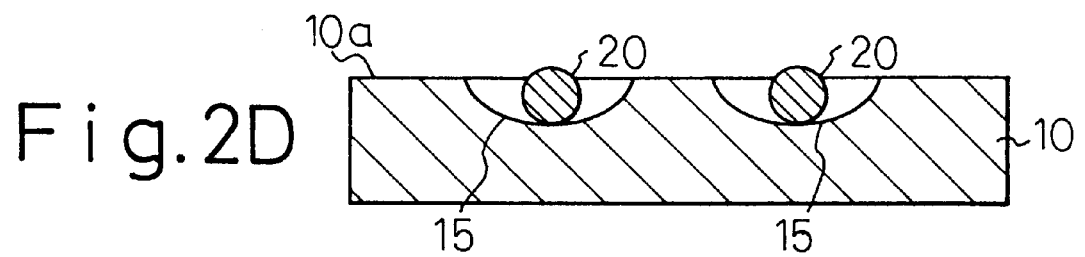
Figure 2E:
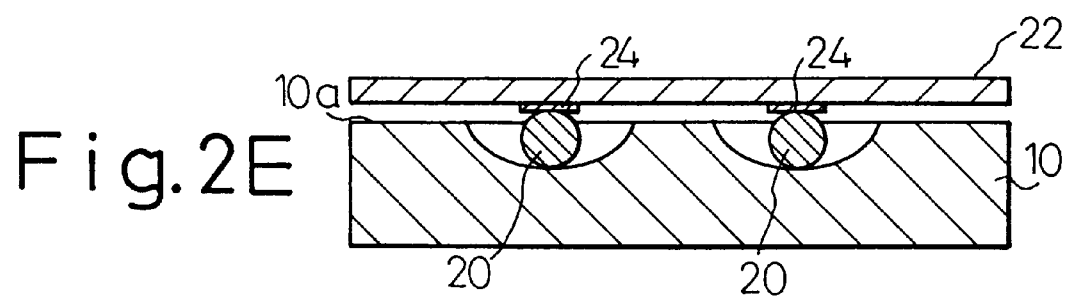
Figure 2F:
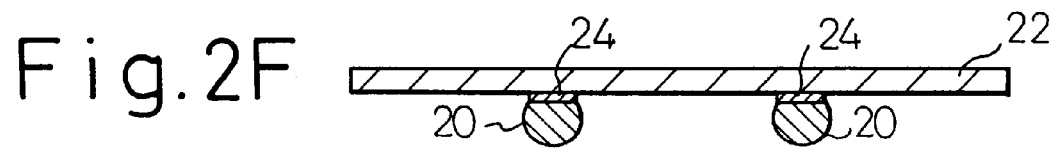

The solder ball forming member 10 is then cooled after forming the solder balls 20 and before transferring the solder balls 20. The flux 15 is washed out, if necessary, as shown in FIG. 2D. The solder balls 20 are then transferred from the solder ball forming member 10 to the first member 22, as shown in FIGS. 2E to 2E. In this instance, the solder balls 20 are heated again.

FIGS. 7 to 10 show examples of semiconductor packages including the first member having the solder bumps (solder balls) 20 formed in the above described manner.

Figure 7:
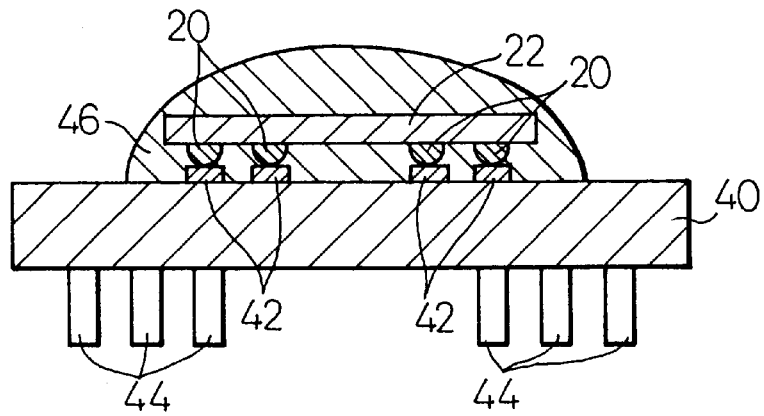
FIG. 7 is a cross-sectional view of a PGA semiconductor package using solder bumps.

FIG. 7 shows a semiconductor package called a pin grid array (PGA), which comprises a ceramic substrate 40 having electrode patterns or electrode pads 42 on the upper surface thereof and pins 44 extending from the lower surface thereof. The electrode pads 42 are connected to the pins 44, and PGA can be mounted to a printed wiring board by attaching the pins 44 to the printed wiring board.

The first member (semiconductor chip in this case) 22 having solder bumps is placed on the ceramic substrate 40 so that the solder bumps (solder balls) 20 rest on the electrode pads 42, and the solder bumps (solder balls) 20 are melted and fused to the electrode pads 42 by heating. The package is finally sealed by a sealing resin 46.

Figure 8:
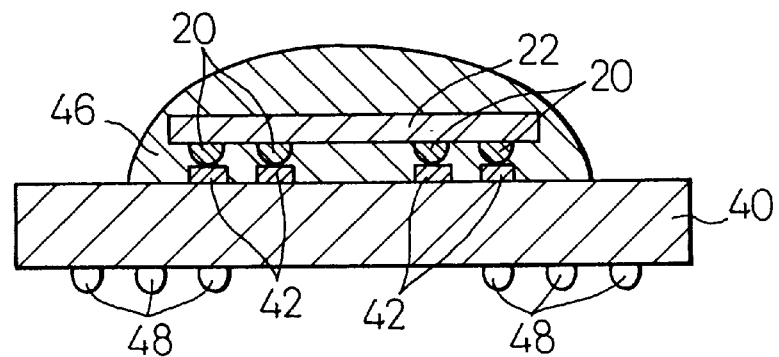
FIG. 8 is a cross-sectional view of a BGA semiconductor package using solder bumps.

FIG. 8 shows a semiconductor package called a ball grid array (BGA). The arrangement of BGA is similar to that of the PGA, except that balls 48 are arranged on the lower surface of the ceramic substrate 40, in place of the pins 44 of the PGA. The balls 48 are fused to the printed wiring board. Therefore, the balls 48 are a kind of solder bump, and so the balls 48 can be fabricated according to the bump fabricating methods of FIGS. 1A to 1E, and FIGS. 2A to 2F, and a further method described later. In this case, for example, each of the cavities 12 has the diameter of 1,000

μm and the depth of 500 μm, and the cavities 12 are arranged at the pitch of 1,270 μm. The solder comprises Sn-37Pb, for example, and the solder ball forming member 10 is heated to 215° C. to form solder balls 20.

Figure 9:
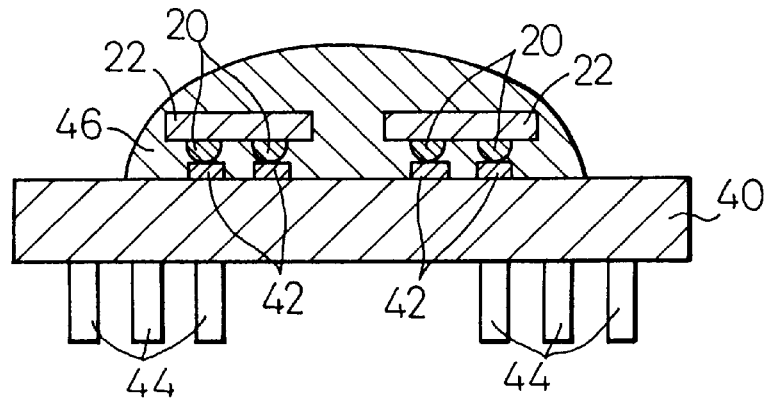
FIG. 9 is a cross-sectional view of a MCM semiconductor package using solder bumps.

FIG. 9 shows a semiconductor package called a multi chip module (MCM), which includes a plurality of first members (semiconductor chips) 22 having solder bumps placed on a ceramic substrate 40 which is similar to the ceramic substrate 40 of FIG. 7. In this case too, the solder bumps (solder balls) 20 are fused to the electrode pads 42 and sealed by a sealing resin 46. It is possible to arrange the MCM, by using a ceramic substrate 40 which is similar to the ceramic substrate 40 of FIG. 8.

Figure 10:
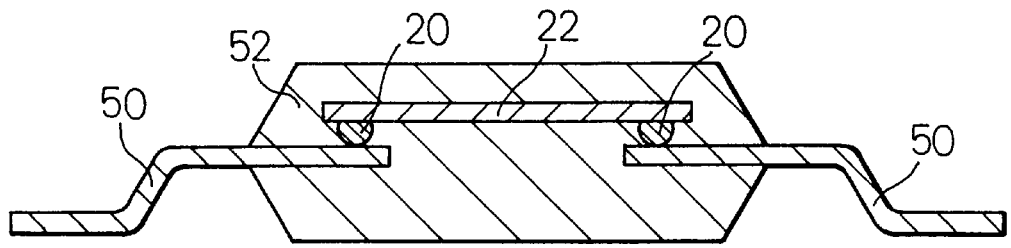
FIG. 10 is a cross-sectional view of a QFP semiconductor package using solder bumps.

FIG. 10 shows a semiconductor package called a quad flat package (QFP). The solder bumps (solder balls) 20 of the first member (semiconductor chip) 22 are fused to leads 50 and sealed by a sealing resin 52.

Figure 11:
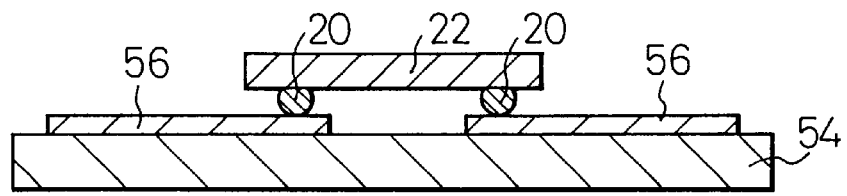
FIG. 11 is a cross-sectional view of a printed wiring board to which a first member having solder bumps is mounted.

FIG. 11 shows an example in which the first member (semiconductor chip) 22 having solder bumps (solder balls) 20 is mounted to a printed wiring board (PWB) 54. The PWB 54 has electrode pads 56, and the solder bumps (solder balls) 20 of the first member 22 are fused to the electrode pads 56 of the PWB 54. It is, of course, possible to form solder bumps (solder balls) 20 onto the PWB 54.

Figure 12:
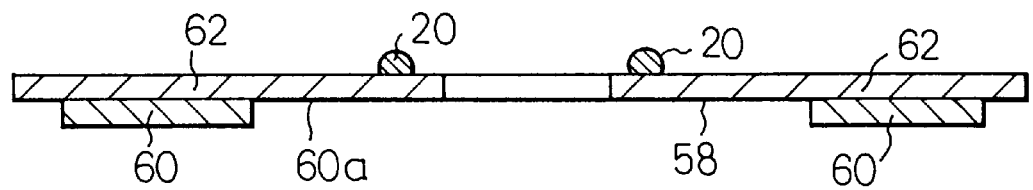
FIG. 12 is a cross-sectional view of a TAB member having solder bumps.
Figure 13:
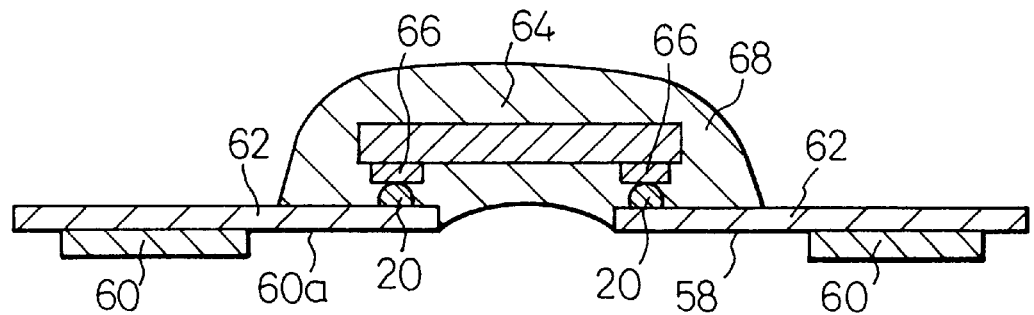
FIG. 13 is a cross-sectional view of the TAB member of FIG. 12 and a semiconductor chip mounted thereto.

FIGS. 12 and 13 show an example in which solder bumps (solder balls) 20 are provided on a TAB member 58. The TAB member 58 corresponds to the first member 22 of FIGS. 1A to 1E, and FIGS. 2A to 2F, and so the solder bumps (solder balls) 20 are fabricated on the TAB member 58 according to the method of FIGS. 1A to 1E, and FIGS. 2A to 2F. The TAB member 58 comprises a plastic tape 60 having central openings 60a and leads 62 attached to the plastic tape 60, the solder bumps (solder balls) 20 being formed on the leads 62. A semiconductor chip 64 having electrode pads 66 is placed on the leads 62 in the central opening 60a of the TAB member 58, the semiconductor chip 64 being attached to the TAB member 58 by the fused solder bumps (solder balls) 20. The semiconductor chip 64 is sealed by a sealing resin 68.

As shown in FIGS. 1A to 6, the cavities 12 of the solder ball forming member 10 are shaped such that the outline at the flat surface 10a of the member 10 is larger than the diameter of the formed solder ball 20 and the depth is generally shallow.

Figure 14:
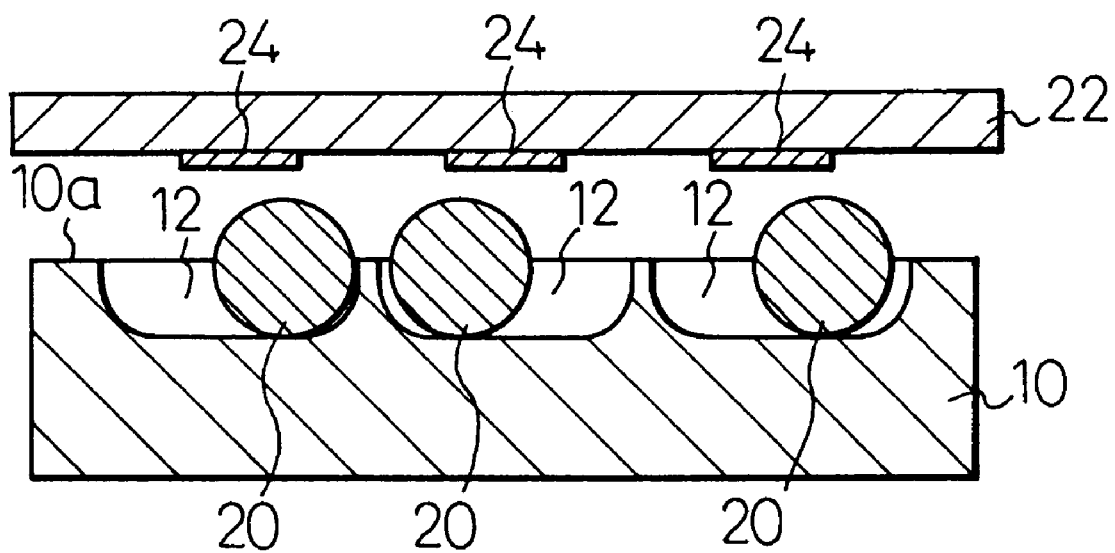
FIG. 14 is a cross-sectional view of the first member having electrode pads and the solder ball forming member having the shallow cavities in which solder balls formed at extreme positions.

In the preparation of the solder ball forming member 10 having the above described shape, there is a possibility that the bottoms of the cavities 12 may be generally flat and the deepest points of the cavities 12 may not be found at fixed positions, as shown in FIG. 14. In the formation of the solder balls 20, the weight of the molten solder mainly rests on the deepest point in each cavity 12 and so the solder ball 20 is formed at the deepest point in each cavity 12. If the deepest points of the cavities 12 are not at fixed positions, the solder balls 20 may be formed at different positions in the cavities 12. Therefore, in the transfer of the solder balls 20, the solder balls 20 may be displaced from the electrode pads 24 of the first member 22 onto which solder bumps are to be formed.

When the molten solder balls 20 are attached to the electrode pads 24, there is a self-alignment tendency so that the molten solder balls 20 are attached to the centers of the electrode pads 24. Therefore, there is no problem in many cases even if the positions of the solder balls 20 are slightly displaced. However, if the solder balls 20 are displaced from the electrode pads 24 to a greater extent, there may be a problem that the solder balls 20 may not be accurately attached the electrode pads 24. Accordingly, it is preferable that the cavities 12 have definite deepest points. When the cavities 12 are formed by machining, the cavities 12 are cut deeper at predetermined positions.

FIGS. 15 to 22 show examples of the solder ball forming member 10 having cavities 12 with purposely formed deepest points so that the solder balls 20 can be formed at the centers of the cavities 12.

Figure 15:
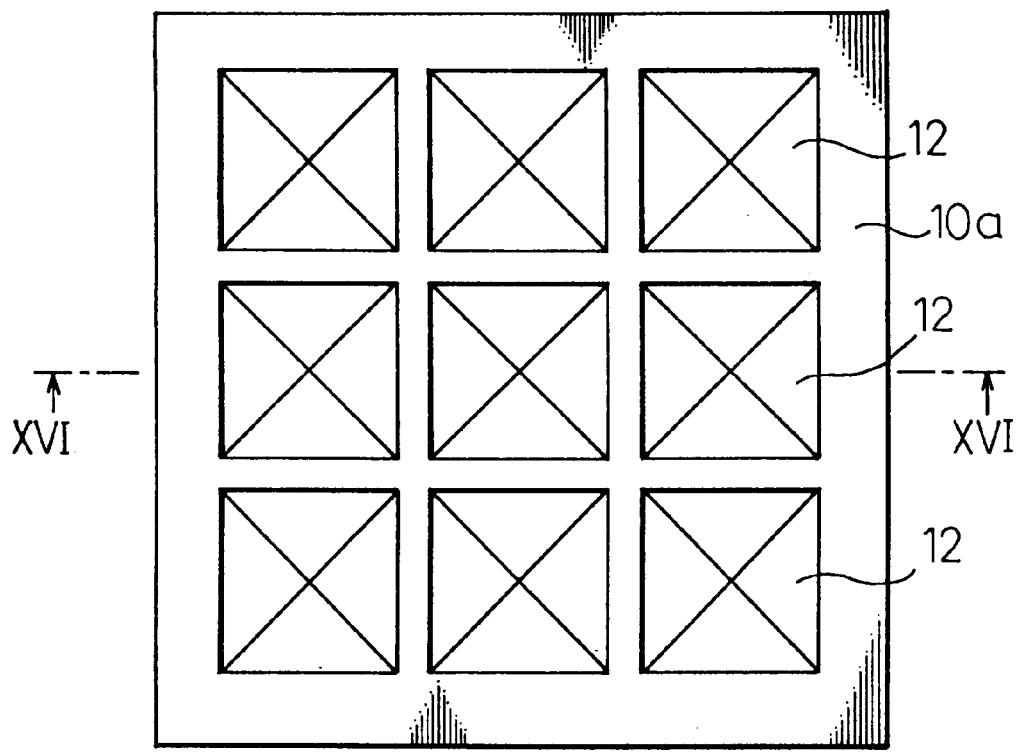
FIG. 15 is a plan view of another example of the solder ball forming member.
Figure 16:
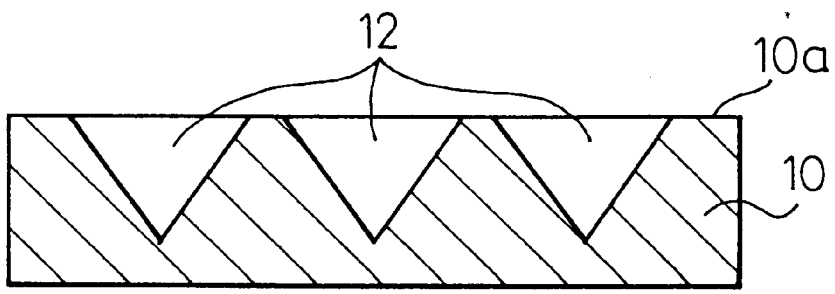
FIG. 16 is a cross-sectional view of the solder ball forming member of FIG. 15, taken along the line XVI—XVI in FIG. 15.

In FIGS. 15 and 16, the solder ball forming member 10 is made from a silicon plate arranged such that the flat surface 10a thereof is in the <100> crystallographic plane of the silicon and the cavities 12 are formed in the flat surface 10a by anisotropic etching. In the etching, a resist having square openings is used, and so quadrangular pyramidal cavities 12 are formed.

Figure 17:
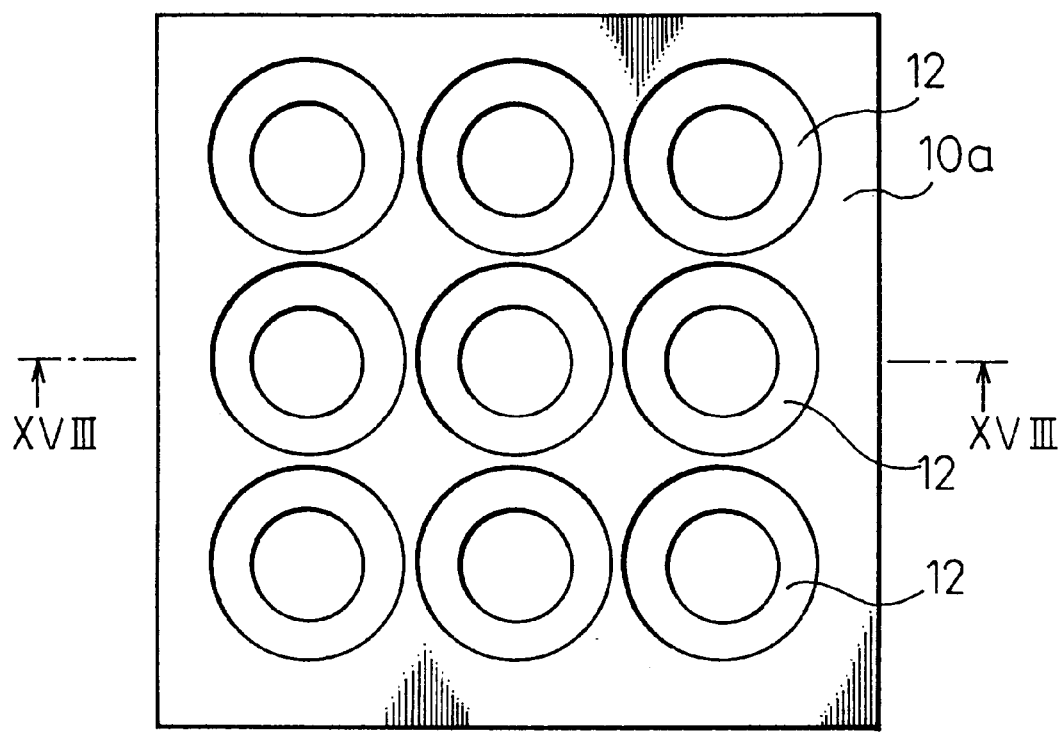
FIG. 17 is a plan view of a further example of the solder ball forming member.
Figure 18:
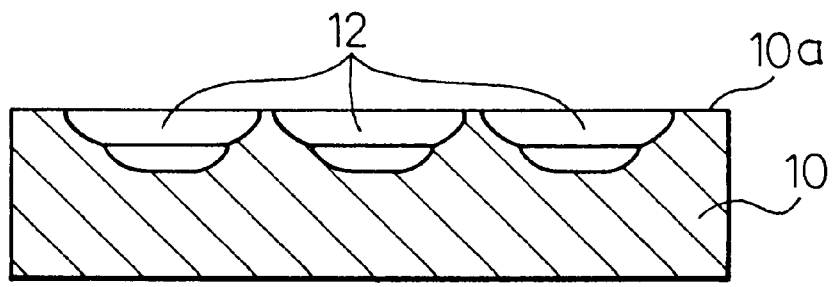
FIG. 18 is a cross-sectional view of the solder ball forming member of FIG. 17, taken along the line XIIIV—XIIIV in FIG. 17.

In FIGS. 17 and 18, the solder ball forming member 10 is made from a stainless steel plate, and the cavities 12 are formed in the flat surface 10a by carrying out etchings twice. A first resist having smaller openings is used in the first etching, and a second resist having openings arranged at the same positions as those of the openings in the first resist and larger than the openings in the first resist. Therefore, the cavities 12 are formed in a two-step recess, and the deepest points exist at the centers of the cavities 12.

Figure 19:
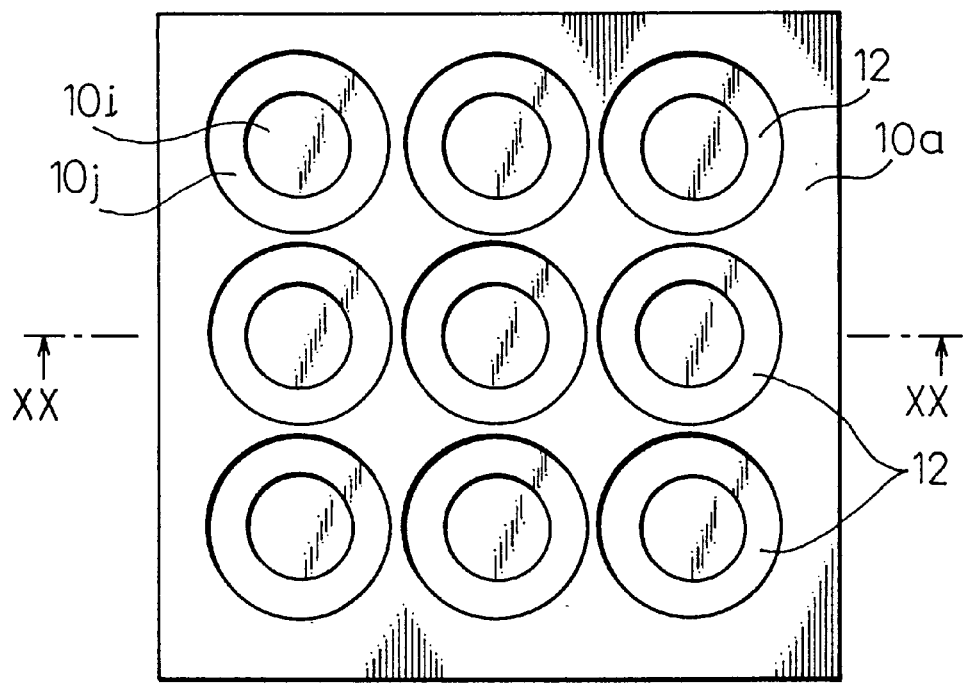
FIG. 19 is a plan view of a further example of the solder ball forming member.
Figure 20:
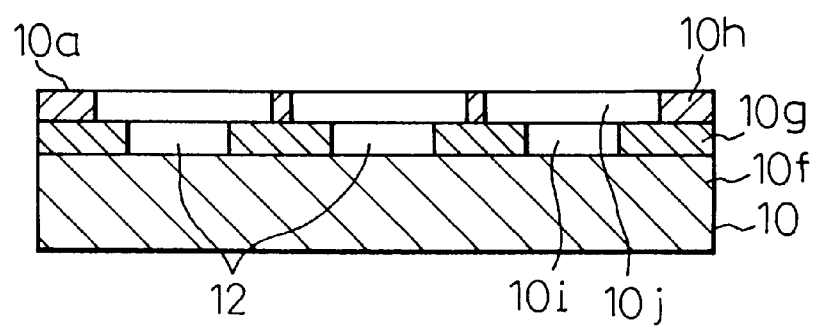
FIG. 20 is a cross-sectional view of the solder ball forming member of FIG. 19, taken along the line XX—XX in FIG. 19.

In FIGS. 19 and 20, the solder ball forming member 10 is made from a plurality of superposed stainless steel plates 10f, 10g and 10h. The first plate 10f has a relatively high rigidity and is flat. The second plate 10h has smaller holes 10i, and the third plate 10h has larger holes 10j. Therefore, each cavity 12 is formed in a two-step recess comprising the smaller hole 10i and the larger hole 10j, and the deepest point exists at the center of the cavity 12. The stainless steel plates 10f, 10g and 10h are joined together by pressing and heat treating. Alternatively, the stainless steel plates 10f, 10g and 10h are joined together by projection welding.

Figure 21:
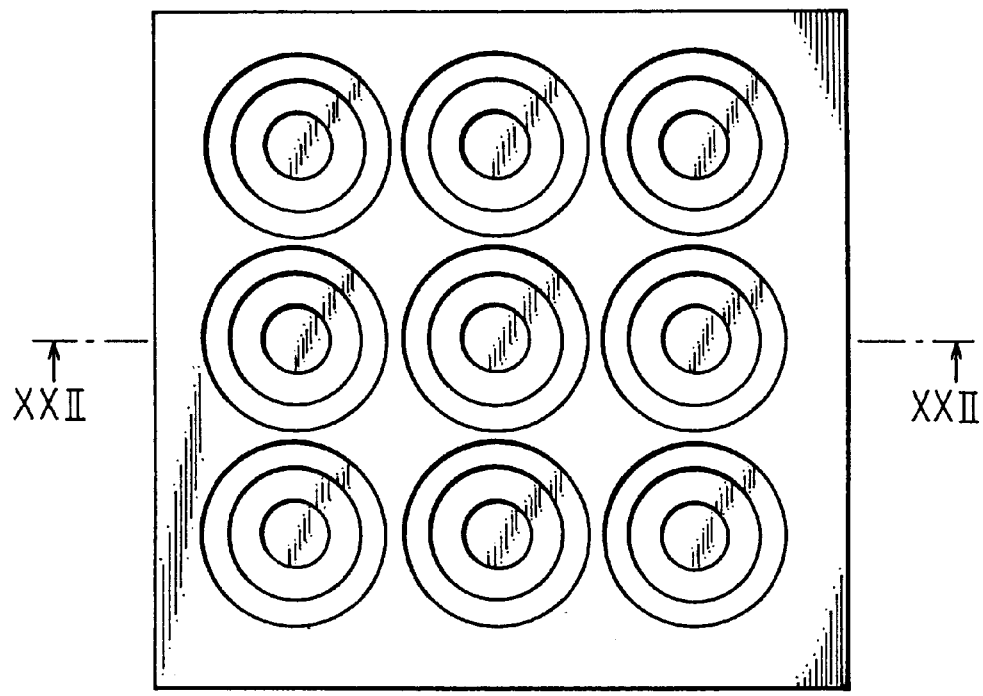
FIG. 21 is a plan view of a further example of the solder ball forming member.
Figure 22:
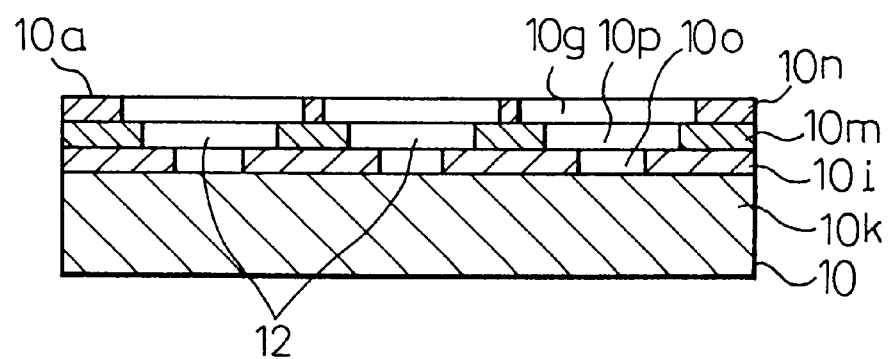
FIG. 22 is a cross-sectional view of the solder ball forming member of FIG. 21, taken along the line XXII—XXII in FIG. 21.

In FIGS. 21 and 22, the solder ball forming member 10 is made from a stainless steel plate 10k, and a plurality of plastic layers 10l, 10m and 10n, superposed one on another. The stainless steel 10k has a relatively high rigidity and is flat. The plastic layers 10l, 10m and 10n have holes 10o, 10p and 10q the sizes of which become larger in this order. Each cavity 12 is formed by the holes 10o, 10p and 10q, and the deepest point exists at the center of the cavity 12.

In one example for realizing the arrangement of FIGS. 21 and 22, the holes 10o, 10p and 10q are firstly formed in the separate plastic layers 10l, 10m and 10n, respectively, and the plastic layers 10l, 10m and 10n are then superposed one on another.

In another example for realizing the arrangement of FIGS. 21 and 22, the plastic layers 10l, 10m and 10n are formed from a light curable plastic. The plastic layer 10l is first applied to the stainless steel plate 10k, and a light is irradiated onto the plastic layer 10l via a mask. A portion of the plastic at which the light is irradiated is cured and a portion of the plastic at which the light is not irradiated is dissolved by a subsequent washing and removed to form the holes 10o. The second plastic layer 10m is then applied to the first plastic layer 10l, and a light is similarly irradiated to form the holes 10p. The third plastic layer 10n is then applied to the second plastic layer 10m, and a light is similarly irradiated to form the holes 10q.

Figure 23A:
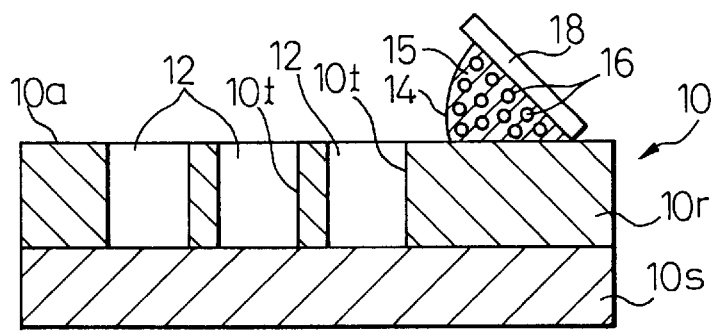
FIGS. 23A to 23E are views illustrating a method for fabricating solder bumps according to the third embodiment of the present invention.

FIGS. 23A to 23E show the third embodiment of the present invention. A solder ball forming member 10 having cavities 12 is first prepared, as shown in FIG. 23A. In this embodiment, the solder ball forming member 10 is made from first and second removably superposed stainless steel plates 10r and 10s. The first plate 10r has a flat surface 10a and through holes 10t providing the annular side wall portions of the cavities 12. The second plate 10s is substantially flat and forms the bottoms of the cavities in the solder ball forming member 10.

The solder ball forming member 10 is made from a material having a low wettability to the solder, or a material having a low wettability to the solder is coated on the solder ball forming member 10, similarly to the previous embodiments.

Figure 23B:
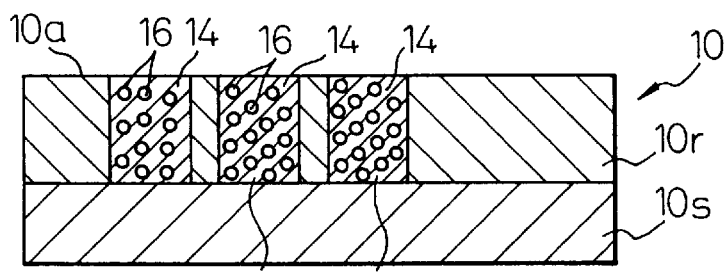

The cavities 12 of the solder ball forming member 10 are then filled with a solder paste 14, using a squeegee 18, as shown in FIGS. 23A and 23B.

Figure 23C:
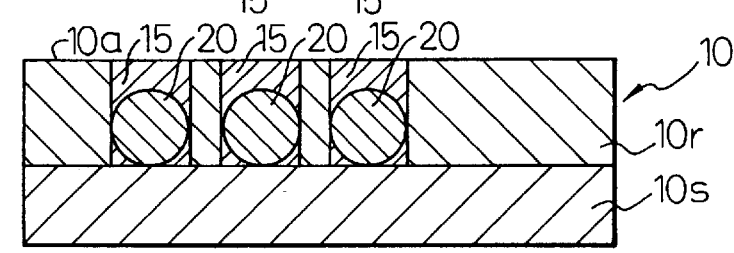

The solder ball forming member 10 is then heated to a temperature higher than the melting point of the solder to cause the solder powder 16 to melt and to form a solder ball 20 in each of the cavities 12 due to a surface tension, as shown in FIG. 23C. The flux 15 is separated from the solder ball 20.

In this embodiment, it is not necessary to shape the cavities 12 such that the solder balls 20 partially project from the flat surface 10a. Therefore, it is possible to form the solder balls 20 having a desired size, by increasing the depth of the cavities 12, and without enlarging the outline of the cavities 12 at the flat surface 10a. Therefore, it is possible to arrange the cavities 12 at a smaller pitch.

The solder balls 20 may be in contact with the annular side wall (wall of the through holes 10t in the first plate 10r) of the cavities 12, and when the solder ball forming member 10 is cooled the solder balls 20 may be retained by the annular side wall (wall of the through holes 10t in the first plate 10r) of the cavities 12.

Figure 23D:
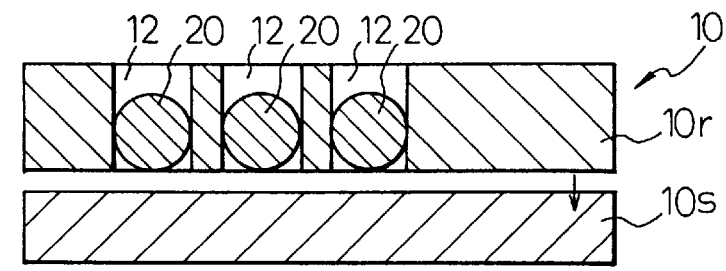
Figure 23E:
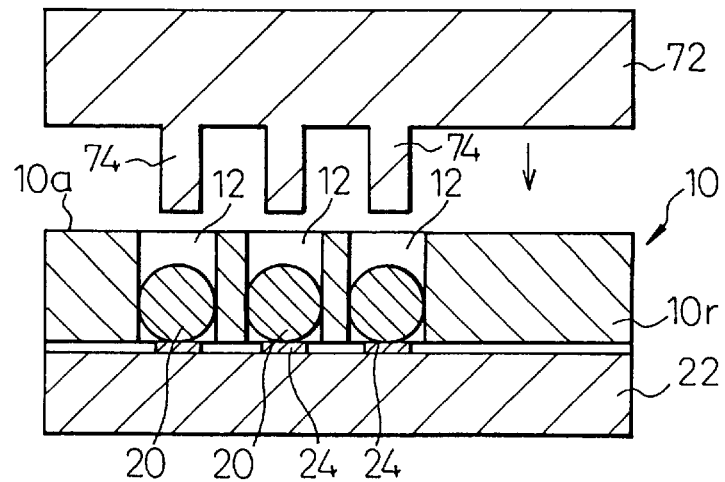

The second plate 10s of the solder ball forming member 10 is then moved away from the first plate 10r, as shown in FIG. 23D. When the flux is washed away, the solder balls 20 only may be retained by the annular side wall (wall of the through holes 10t in the first plate 10r) of the cavities 12.

The first member 22, onto which the solder bumps are to be formed, is then moved toward a second surface of the first plate 10r opposite from the flat surface 10a, so that the heated solder balls 20 are bought into abutment with the first member 22, as shown in FIG. 25E. The first plate 10r of the solder ball forming member 10 is heated at an appropriate time before this movement. Therefore, the solder balls 20 are transferred from the first plate 10r of the solder ball forming member 10 to the first member 22.

In addition, a pushing plate 72 is used. The pushing plate 72 has projections 74 adapted for insertion into the cavities 12 (the through holes 10t in the first plate 10r). By moving the pushing plate 72 to the first plate 10r of the solder ball forming member 10, the projections 74 push the solder balls 20 out of the first plate 10r and into abutment with the first member (semiconductor chip) 22 so that solder balls 20 are firmly attached to the first member 22 as solder bumps.

FIGS. 24A to 24E show the fourth embodiment of the present invention, illustrating a method for fabricating solder balls.

Figure 24A:
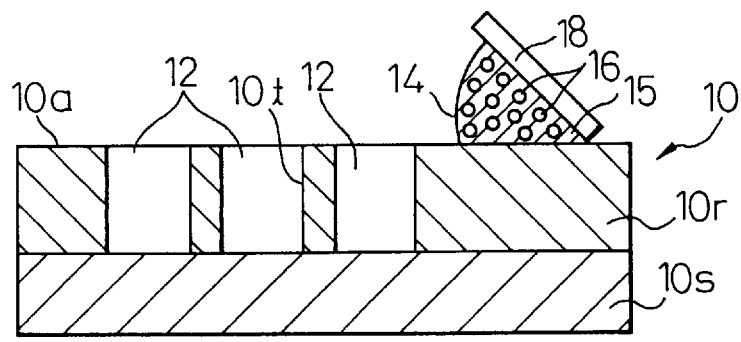
FIGS. 24A to 24E are views illustrating a method for fabricating solder balls according to the fourth embodiment of the present invention.

A solder ball forming member 10 having a flat surface and cavities 12 is first prepared, as shown in FIG. 24A. The solder ball forming member 10 is made from first and second removably superposed stainless steel plates 10r and 10s, similar to the previous embodiment. The first plate 10r has a flat surface 10a and through holes 10t providing the annular side wall portions of the cavities 12. The second plate 10s is substantially flat and forms the bottoms of the cavities of the solder ball forming member 10.

The solder ball forming member 10 is made from a material having a low wettability to the solder, or a material having a low wettability to the solder is coated onto the solder ball forming member 10, similarly to the previous embodiments.

Figure 24B:
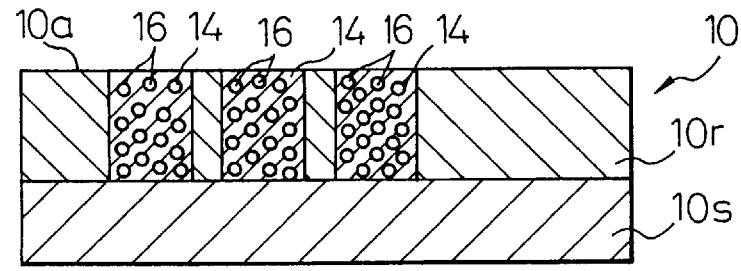

The cavities 12 of the solder ball forming member 10 are then filled with a solder paste 14, using a squeegee 18, as shown in FIGS. 24A and 24B.

Figure 24C:
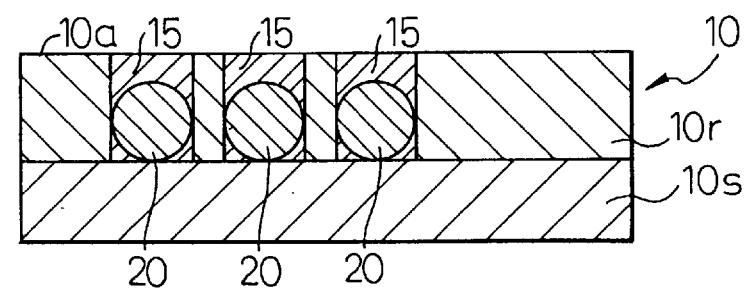
Figure 24D:
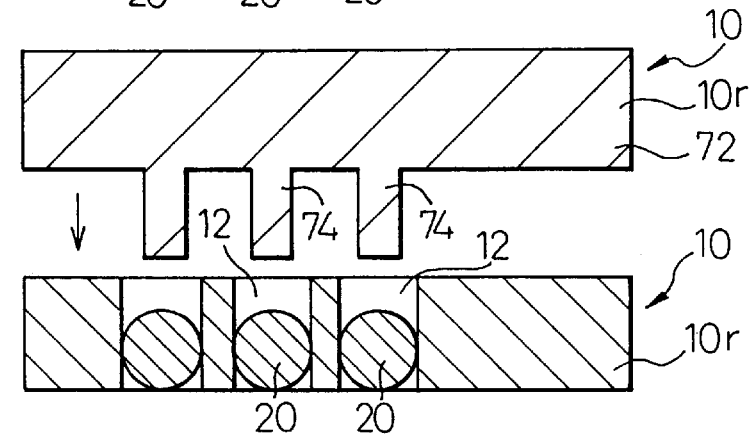

The solder ball forming member 10 is then heated to a temperature higher than the melting point of the solder to cause the solder powder 16 to melt and to form a solder ball 20 in each of the cavities 12 due to a surface tension, as shown in FIG. 24C. The size of the solder balls 20 is determined by the shape of the cavities 12. The size of the solder balls 20 is uniform if the shape of the cavities 12 is uniform.

The second plate 10s of the solder ball forming member 10 is then moved away from the first plate 10r, and the first plate 10r of the solder ball forming member 10 is then cooled. The flux 15 is then washed away. In this case, the cavities 12 of the solder ball forming member 10 are shaped such that the solder balls 20 which are cooled to become solid bodies are not tightly retained in the cavities 12.

Figure 24E:
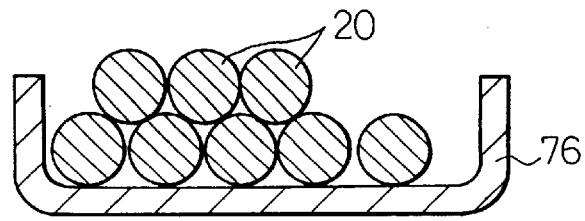

Therefore, the solder balls 20 fall down from the cavities 12 when the flux 15 is washed. Accordingly, the solder balls 20 can be collected in a receptacle 76, as shown in FIG. 24E.

When the solder balls 20 do not easily fall out of the cavities 12, a pushing plate 72 can be used. The pushing plate 72 has projections 74 adapted for insertion into the cavities 12 (the through holes 10t in the first plate 10r). By moving the pushing plate 72 to the first plate 10r of the solder ball forming member 10, the projections 74 push the solder balls 20 out of the first plate 10r.

FIGS. 25A to 25D show the fifth embodiment of the present invention, illustrating a method for fabricating solder balls.

Figure 25A:
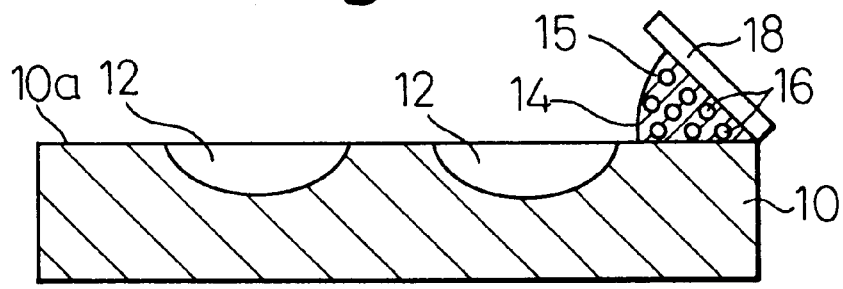
FIGS. 25A to 25D are views illustrating a method for fabricating solder balls according to the fifth embodiment of the present invention.

A solder ball forming member 10 having a flat surface and cavities 12 is first prepared, as shown in FIG. 25A. The solder ball forming member 10 is made from a material having a low wettability to the solder, or a material having a low wettability to the solder is coated onto the solder ball forming member 10.

Figure 25B:
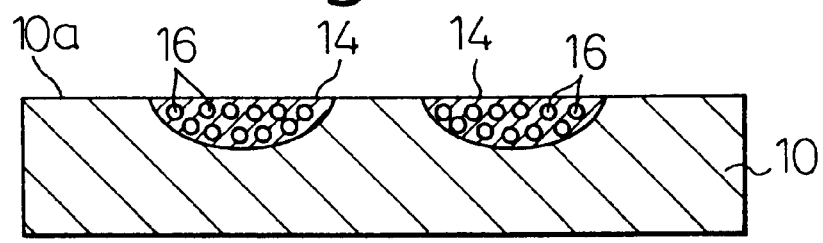
Figure 25C:
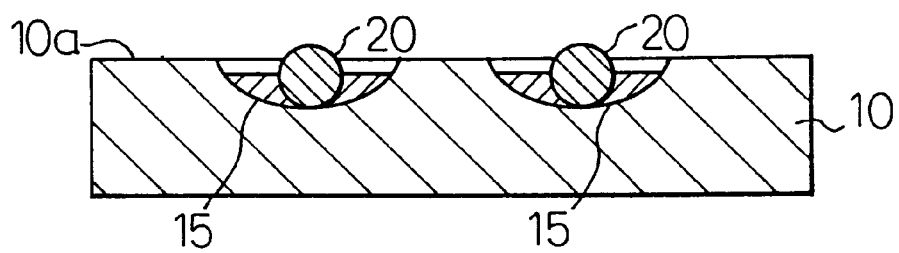

The cavities 12 of the solder ball forming member 10 are then filled with a solder paste 14, using a squeegee 18, as shown in FIGS. 25A and 25B.

Figure 27A:
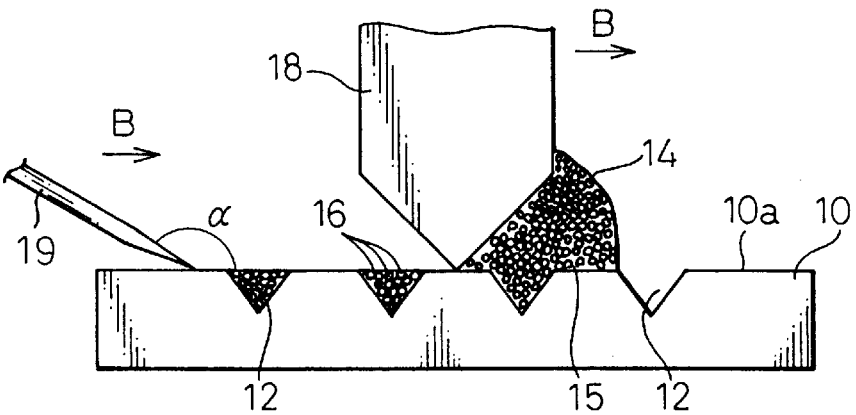
FIGS. 27A to 27D are views illustrating a method for fabricating solder bumps according to the sixth embodiment of the present invention.
Figure 27B:
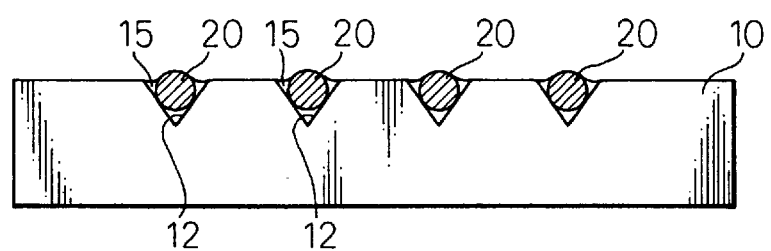
Figure 27C:
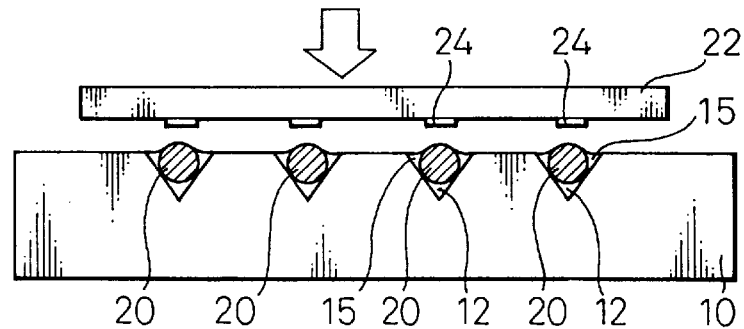

The solder ball forming member 10 is then heated to a temperature higher than the melting point of the solder to cause the solder powder 16 to melt and to form a solder ball 20 in each of the cavities 12 due to surface tension, as shown in FIG. 27C. The size of the solder balls 20 is determined depending on the shape of the cavities 12. The size of the solder balls 20 is uniform if the shape of the cavities 12 is uniform.

Figure 25D:
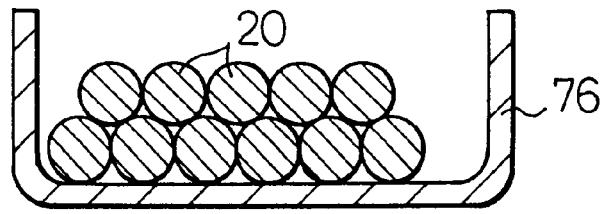

The solder ball forming member 10 is then cooled, and the flux 15 is washed away. The solder balls 20 can thus fall out of the cavities 12, and may be collected in a receptacle 76, as shown in FIG. 25D.

Figure 26:
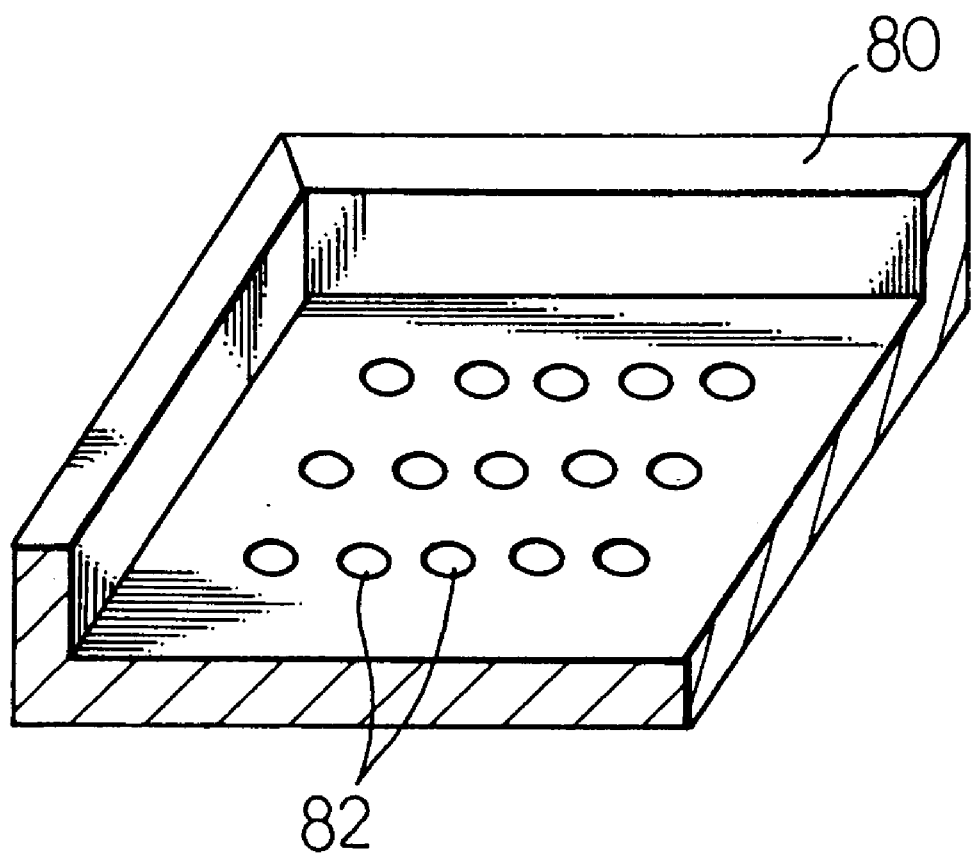
FIG. 26 is a partially cutaway perspective view of the ball arranging tool used for arranging solder balls.

The solder balls 20 thus fabricated can be used for forming solder bumps in any electric or electronic device. For example, it is possible to use the solder balls 20 for forming the balls 48 of the BGA of FIG. 8. The solder balls 20 can be arranged onto the BGA one by one, or alternatively, the solder balls 20 can be arranged onto the BGA all together, using a ball arranging tool 80 shown in FIG. 26, for example. The ball arranging tool 80 has holes 82 arranged in a pattern corresponding to the positions of the balls 48 of the BGA, and the size of the holes 82 is slightly larger than the diameter of the solder balls 20. The ball arranging tool 80 is placed on the BGA, and the solder balls 20 are rolled on the surface of the ball arranging tool 80. The solder balls 20 enter the holes 82 one by one. The ball arranging tool 80 or the BGA is then heated, so that the solder balls 20 are fused to the BGA. It is possible to obtain the solder balls 20 having a uniform size according to the present invention and accordingly, a tool like the ball arranging tool 80 can be used.

As explained in greater detail, according to the present invention, it is possible to form solder bumps in a relatively easy manner, and to realize a method for fabricating solder bumps and solder balls which is adapted for mass production.

FIGS. 27A to 27D are views illustrating a method for fabricating solder bumps or solder balls according to the sixth embodiment of the present invention. This method is generally similar to that shown in FIGS. 1A to 1E, except that a knife edge 19 is used in addition to the squeegee 18. When the squeegee 18 is used in the step of filling the cavities 12 with solder paste, the squeegee 18 pushes and conveys solder paste along the flat surface 10a of the solder ball forming member 10, and it is supposed that solder paste will not remain on the flat surface 10a of the solder ball forming member 10 nor be undesirably attached to the flat surface 10a of the solder ball forming member 10. However, solder paste may actually remain on and be attached to the flat surface 10a of the solder ball forming member 10. If solder paste remains on the flat surface 10a, the following problems arise. When solder balls are transferred from the solder ball forming member 10 to a printed wiring board, unexpected solder may be attached to the printed wiring board and may become a conductive contaminant. Also, if a surplus solder paste bulges from the flat surface 10a of the solder ball forming member 10 near the cavities 12, the amount of solder paste measured depending on the volumes of the cavities 12 may become nonuniform.

The squeegee 18 is usually made from an elastomer such as hard urethane and pressed against the solder ball forming member 10 under a considerable pressure, so that the edge portion of the squeegee 18 is elastically deformed and uniformly contacts the solder ball forming member 10 over the full width thereof. If the squeegee 18 is relatively soft, the squeegee 18 is easily deformed and the action of conveying solder paste along the flat surface 10a of the solder ball forming member 10 becomes weak, so that solder paste may remain on and be undesirably attached to the flat surface 10a of the solder ball forming member 10 near the cavities 12. If the squeegee 18 is relatively hard, the squeegee 18 is not so easily deformed and may not uniformly contact the flat surface 10a of the solder ball forming member 10; for example, one end of edge portion of the squeegee 18 may strongly contact the solder ball forming member 10 but the other end may loosely contact the solder ball forming member 10. In this case, more solder paste may remain on the flat surface 10a of the solder ball forming member 10 and the amount of solder paste in the cavities becomes nonuniform. To solve this problem, the knife edge 19 is used. Hereinafter, the word, "knife edge" is intended not only to mean an edge itself but also to include a body supporting the edge.

In FIG. 27A, the solder ball forming member 10 is first prepared, and the cavities 12 are filled with solder paste 14 by the squeegee 18, as explained with reference to FIGS. 1A. The solder ball forming member 10 is made from a stainless steel plate, or silicon. A plurality of identically shaped cavities 12 are formed on the flat surface 10a by machining, electroerosion machining, or etching, and the flat surface 10a is covered with an oxidation layer. The solder paste 14 comprises, for example, solder powder 16 of Pb-5Sn (powder size 10–25 μm) mixed in and kneaded with a flux vehicle including resin and glycol based solvent. The resultant solder paste 14 has a viscosity of 500 poise.

In FIG. 27A, the knife edge 19 is slidably moved along the flat surface 10a of the solder ball forming member 10 in the direction of the arrow B, after the cavities 12 are filled with solder paste 14 by moving the squeegee 18 in the direction of the arrow B. The knife edge 19 is arranged at an obtuse angle α between the knife edge 19 and the flat surface 10a of the solder ball forming member 10, taken toward the leading side of the moving direction B from the knife edge, i.e., the knife edge 19 faces the advancing direction. The knife edge 19 is made from a material harder than the squeegee 18 and is sharper than the squeegee 18, so that the knife edge 19 can peel a surplus solder paste 14 remaining on the flat surface 10a of the solder ball forming member 10 at any position especially near the cavities 12.

The squeegee 18 is made from an elastomer such as hard urethane and the knife edge 19 is made from ceramics or metal, for example. Preferably, the solder ball forming member 10 is made from ceramics which is harder than the knife edge 19, so a remaining surplus solder paste 14 can be removed without the solder ball forming member 10 being damaged even if the solder ball forming member 10 is rubbed by the knife edge 19. Therefore, it is possible to prevent solder paste 14 from undesirably remaining on the flat surface 10a of the solder ball forming member 10, and to accurately measure solder paste 14 by the cavities 12.

Figure 27D:
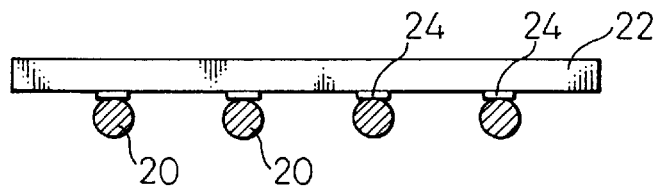

The solder ball forming member 10 is then heated to form solder balls 20, as shown in FIG. 27B. The first member 22 such as a semiconductor chip or a printed wiring board is then relatively moved toward the solder ball forming member 10, as shown in FIG. 27C, and the heated solder balls 20 are transferred from the solder ball forming member 10 to the first member 22, as shown in FIG. 27D. The first member 22 has electrode pads 24.

It is also possible to use the solder balls 20 which are removed from the solder ball forming member 10, after the step of FIG. 27B, as described with reference to FIGS. 25A to 25D.

Figure 28:
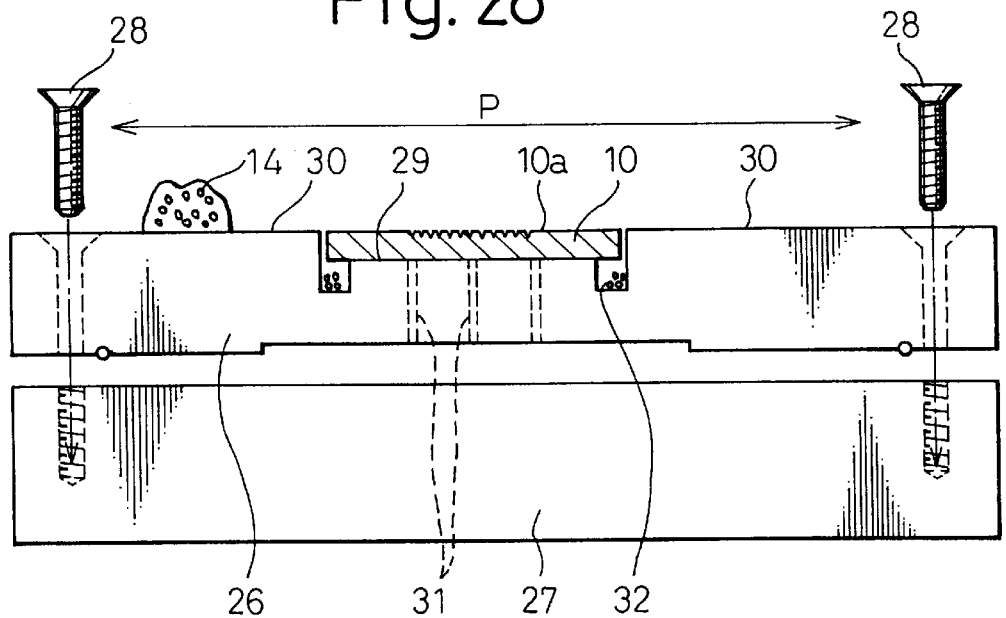
FIG. 28 is a diagrammatic side view of an example of an apparatus for forming the solder bumps, including a stage for supporting the solder ball forming member of FIG. 27A.
Figure 29:
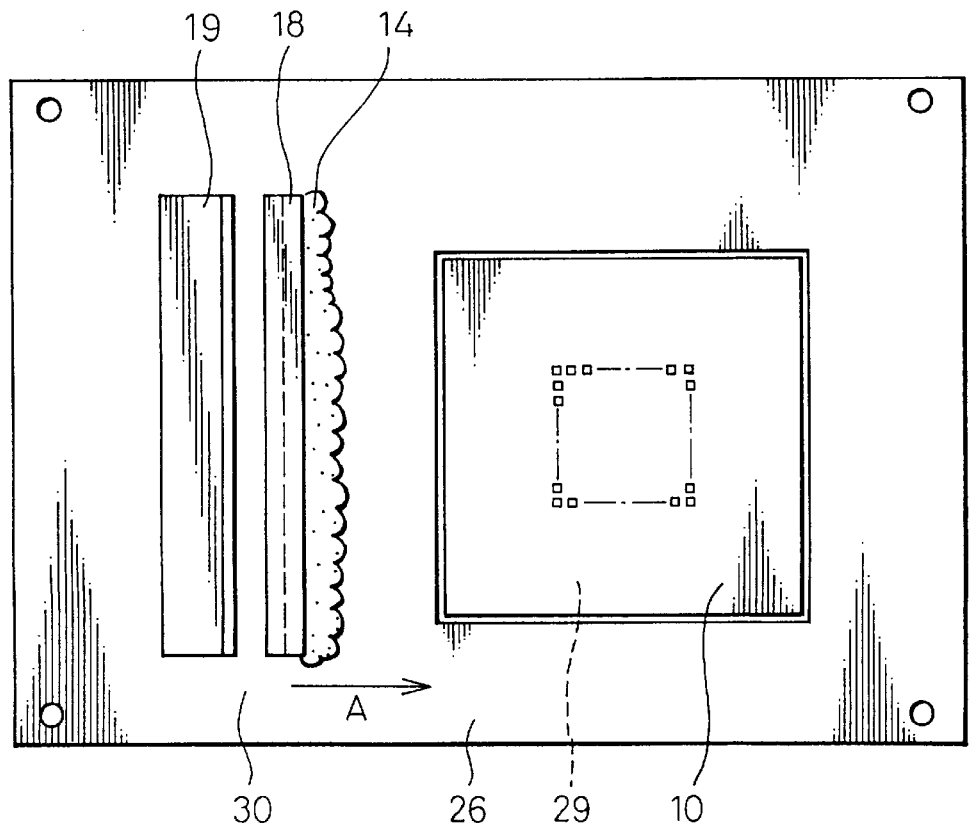
FIG. 29 is a plan view of the stage of FIG. 29.

FIGS. 28 and 29 show an example of an apparatus for forming solder bumps. The apparatus includes a stage 26 for supporting the solder ball forming member 10 of FIG. 27A and a support frame 27. The stage 26 can be fixed to the support frame 27 by screws 28.

The stage 26 has a first, central support surface 29 for supporting the solder ball forming member 10 thereon and a second, peripheral support surface 30 which is substantially flush with the flat surface 10a of the solder ball forming member 10 when it is supported on the first support surface 29. Preferably, the flat surface 10a of the solder ball forming member 10 is slightly higher than the second support surface 30, for example, by 10 to 100 μm.

The stage 26 has vacuum chucks 31 which are open at the first support surface 29 to hold the solder ball forming member 10, the vacuum chucks 31 being connected to a vacuum source (not shown). There are waste paste accommodating holes 32 between the first support surface 29 and the second support surface 30. The clearance between the first support surface 29 and the second support surface 30 is as small as possible but it is not possible to reduce this clearance to zero, and in this situation, some of the solder paste 14 drops into this clearance and enters the waste paste accommodating holes 32 when the squeegee 18 is moved from the second support surface 30 to the flat surface 10a.

In this apparatus, a sufficient amount of solder paste 14 is put on the second support surface 30. The squeegee 18 is also put on the second support surface 30 and is moved from the second support surface 30 to the flat surface 10a of the solder ball forming member 10 on the first support surface 29, then further to the second support surface 30 beyond the first support surface 29. The moving stroke of the squeegee 18 is shown by the arrow P.

The knife edge 19 is arranged to follow the squeegee 18, but initially, the knife edge 19 is arranged at a position above the second support surface 30. The knife edge 19 is moved from that position above the second support surface 30 to a position above the flat surface 10a of the solder ball forming member 10, and thereafter, lowered onto the flat surface 10a of the solder ball forming member 10 and pressed against the flat surface 10a of the solder ball forming member 10. Therefore, the knife edge 19 does not become caught by the clearance between the first support surface 29 and the second support surface 30. Further, the squeegee 18 is formed bidirectionally, as shown in FIG. 27A, i.e., it can be moved in the direction of the arrow A in FIG. 27A while pushing the solder paste 14, and, after it passes over the flat surface 10a of the solder ball forming member 10, it can be moved in reverse while pushing the solder paste 14. In this case, the knife edge 19 is lowered after the final stroke of the squeegee 18.

Figure 30:
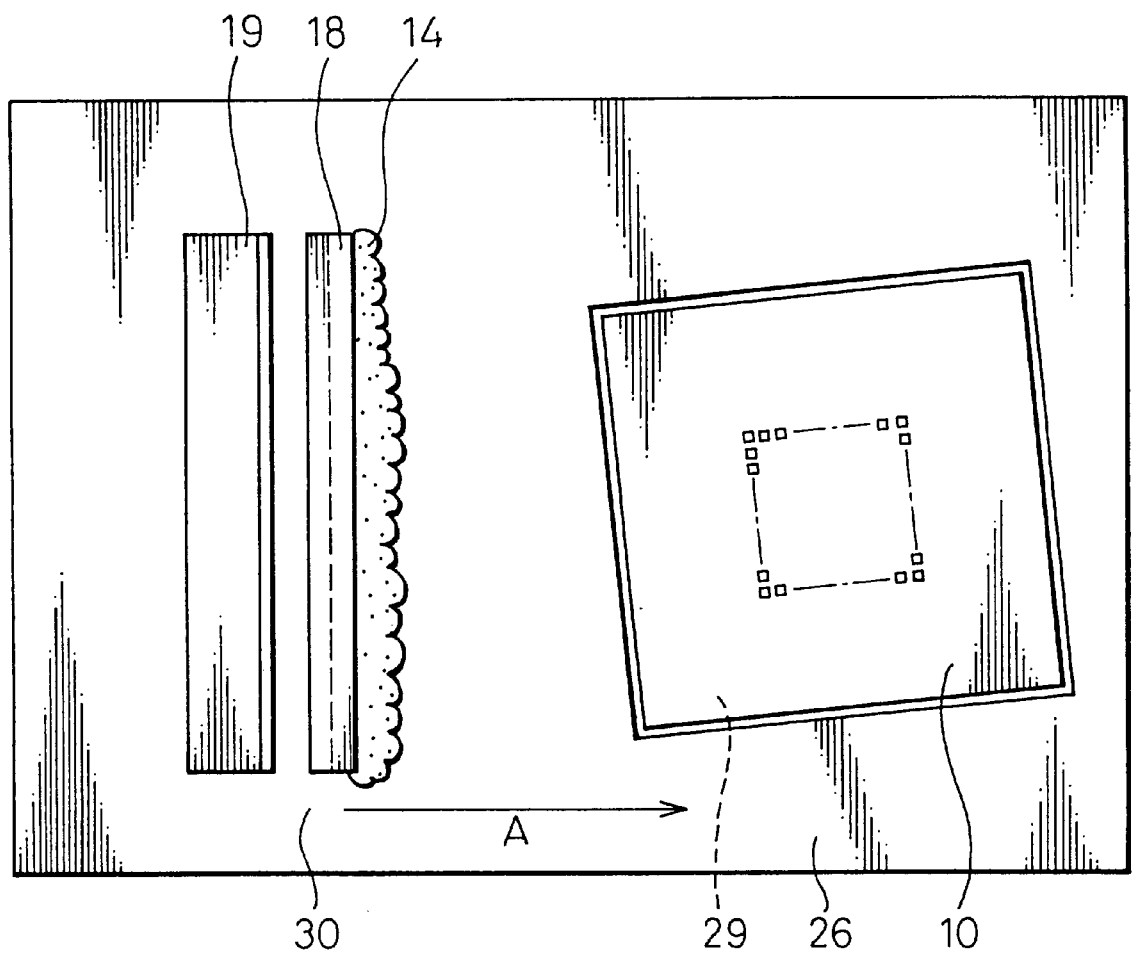
FIG. 30 is a plan view of the modified stage.

FIG. 30 shows the modified stage 26, similar to the stage 26 of FIG. 29. In FIG. 30, the stage 26 has a first support surface 29 and a second support surface 30, but the transverse side of the first support surface 29 is inclined relative to the moving direction of the squeegee 18. That is, the squeegee 18 is arranged at an angle relative to the solder ball forming member 10 on the first support surface 29, viewed from above. Therefore, when the squeegee 18 is continuously moved from the second support surface 30 to the flat surface 10a of the solder ball forming member 10 on the first support surface 29, the squeegee 18 can smoothly pass through the clearance between the first support surface 29 and the second support surface 30.

Figure 31:
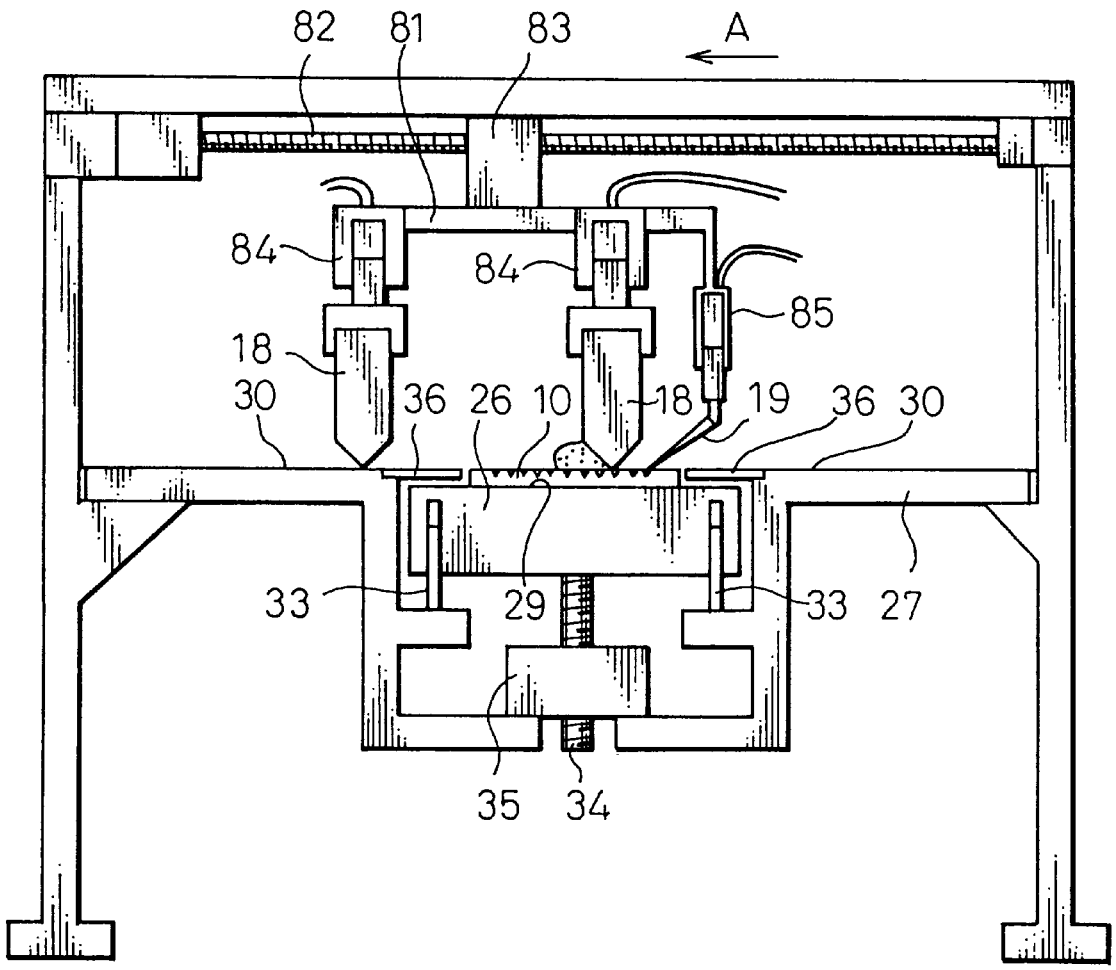
FIG. 31 is a plan view of a further example of an apparatus for forming the solder bumps.

FIG. 31 shows a further example of the apparatus for forming the solder bumps in more details. The apparatus includes a stage 26 and a support frame 27, similarly to the embodiment of FIG. 28. The stage 26 is vertically guided relative to the support frame 27 by vertical guide rods 33 and moved up and down by a vertical feed screw 34 and an actuator 35 which includes a motor and a nut engaging with the feed screw 34.

The stage 26 provides a first support surface 29 for supporting the solder ball forming member 10, and a part of the support frame 27 provides a second surface 30 which is substantially flush with the flat surface 10a of the solder ball forming member 10. In addition, an adapter 36 is removably attached to the support frame 27 so that the adapter 36 provides a part of the second surface 30. The adapter 36 can be replaced depending on the kind or size of the solder ball forming member 10.

Figure 32:
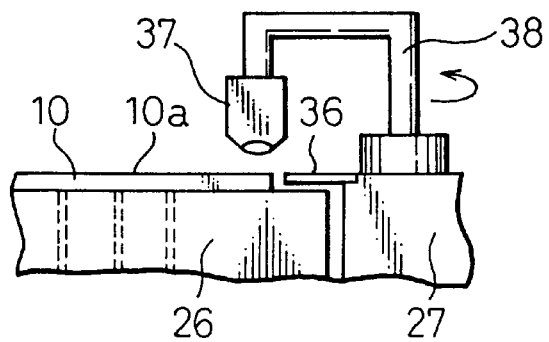
FIG. 32 is a view illustrating a height detector arranged in the stage of FIG. 31.

A detector 37 is arranged for detecting the height of the solder ball forming member 10 supported by the stage 29, as shown in FIG. 32. The detector 37 comprises a height detecting camera carried by a rotatable support member 38 aiming at the boundary between the flat surface 10a of the solder ball forming member 10 and the surface of the adapter 36. The actuator 35 controls the height of the stage 29 in response to the signal from the detector 37 until the flat surface 10a of the solder ball forming member 10 and the surface of the adapter 36 are brought into focus. When the adapter 36 is not provided, the flat surface 10a of the solder ball forming member 10 and the surface of the part of the support frame 27 forming the second support surface 30 are brought into focus. In this case too, preferably, the flat surface 10a of the solder ball forming member 10 is slightly higher than the second support surface 30.

A carriage 81 and a feed screw 82 are arranged above the support frame 27, and an actuator 83 including a motor and a nut is arranged between the carriage 81 and the feed screw 82. In this example, two squeegees 18 and one knife edge 19 are supported by the carriage 81 by pneumatic cylinders 84 and 85, respectively. The pneumatic cylinders 84 and 85 are independently controlled.

The squeegees 18 is moved up and down relative to the solder ball forming member 10 by the pneumatic cylinder 84 and moved horizontally by the feed screw 82 in the direction of the arrow A and in reverse. That is, the squeegee 18 is slidably moved on the flat surface 10a of the solder ball forming member 10 with the solder ball forming member 10 supported by the first support surface 29. Similarly, the knife edge 19 is slidably moved on the flat surface 10a of the solder ball forming member 10 by the pneumatic cylinder 85 and the feed screw 82, for peeling the solder paste 14 remaining on the flat surface 10a of the solder ball forming member 10. The knife edge 19 is arranged at an obtuse angle between the knife edge 19 and the flat surface 10a of the solder ball forming member 10, taken toward the leading side of the moving direction B from the knife edge 19.

We claim:

1. A method for fabricating solder bumps, said method comprising the steps of:

preparing a solder ball forming member having a flat surface and a plurality of cavities arranged on said flat surface in a pattern;

filling said cavities with a solder paste including solder powder and a flux;

heating said solder ball forming member to cause the solder powder contained in the solder paste in each of said cavities to melt and to form solder balls due to surface tension;

moving a first member onto which solder bumps are to be formed toward the solder ball forming member to transfer the heated solder balls from the solder ball forming member to the first member; and cooling the solder ball forming member after the solder balls have formed and before the solder balls have been transferred to the first member.

2. A method for fabricating solder bumps according to claim 1, wherein said predetermined pattern is produced by etching in such a manner that each of the cavities has at least two inclined bottom surfaces and a deepest portion at a juncture of said at least two inclined bottom surfaces, and the profile of at least one of the cavities becomes smaller as the depth increases.

3. A method for fabricating solder bumps according to claim 1, wherein the first member comprises one of a semiconductor chip, a semiconductor package, a printed wiring board, and a TAB member, and wherein at least a portion of the solder ball forming member including said flat surface is made from a material having a lower wettability with regard to the solder than that portion of the first member at which solder bumps are to be formed.

4. A method for fabricating solder bumps according to claim 1, wherein the first member onto which solder bumps are to be formed comprises an IC chip.

5. A method for fabricating solder bumps according to claim 1, wherein the first member onto which solder bumps are to be formed comprises leads of a TAB tape.

6. A method for fabricating solder bumps according to claim 1, wherein the step of filling said cavities of the solder ball forming member with a solder paste comprises applying a solder paste to the flat surface of the solder ball forming member and moving a squeegee along the flat surface of the solder ball forming member.

7. A method for fabricating solder bumps according to claim 1, wherein the cavities of the solder ball forming member have such a shape that the solder ball formed in each of the cavities in the solder ball forming step partially projects above the flat surface of the solder ball forming member, and wherein said solder ball transferring step comprises moving the first member toward said flat surface of the solder ball forming member.

8. A method for fabricating solder bumps according to claim 7, further comprising the step of cooling the solder ball forming member after the solder balls have formed and before the solder balls have been transferred to the first member, the step of heating including heating at least one of the solder ball forming member and the first member.

9. A method for fabricating solder bumps according to claim 7, wherein at least one of the cavities of the solder ball forming member has an outline at said flat surface, a bottom, and a depth from said flat surface to the bottom, the size of said outline being larger than the size of the outline of the solder ball to be formed.

10. A method for fabricating solder bumps according to claim 9, wherein the depth of at least one of the cavities is smaller than the diameter of the solder ball to be formed.

11. A method for fabricating solder bumps according to claim 7, wherein the outline of a cavity at said flat surface is substantially circular.

12. A method for fabricating solder bumps according to claim 7, wherein the outline of at least one of the cavities at said flat surface is substantially polygonal.

13. A method for fabricating solder bumps according to claim 9, wherein the profile of the cavity becomes smaller stepwise as the depth increases.

14. A method for fabricating solder bumps according to claim 1, wherein the solder ball forming member comprises a single plate.

15. A method for fabricating solder bumps according to claim 1, wherein the solder ball forming member comprises a plurality of superposed plates, at least one of said superposed plates having through holes, each of said through holes forming a part of at least one of the cavities.

16. A method for fabricating solder bumps according to claim 1, wherein at least one of the cavities of the solder ball forming member has an outline at said flat surface, a bottom, and an annular side wall portion interconnecting the flat surface to the bottom, the solder ball forming member comprises first and second removably superposed plates, said first plate having a flat surface providing said flat surface of the solder ball forming member and through holes providing an annular side wall portion, said second plate forming said bottoms of the cavities of the solder ball forming member, and wherein said solder ball transferring step comprises the steps of moving the second plate away from the first plate with the solder balls retained in the first plate, and moving the first member toward a second surface of the first plate opposite from said flat surface.

17. A method for fabricating solder bumps according to claim 16, wherein said solder ball transferring step further comprises pushing the solder balls retained in the first plate toward the first member.

18. A method for fabricating solder bumps according to claim 1, wherein said solder ball forming member is made from a silicon plate and the cavities are formed in the flat surface by anisotropic etching.

19. A method for fabricating solder bumps according to claim 1, wherein said solder ball forming member is made from a silicon plate arranged such that the flat surface is in the <100> crystallographic plane of the silicon and the cavities are formed in the flat surface by anisotropic etching.

20. A method for fabricating solder bumps according to claim 19, wherein the cavity of the solder ball forming member has a square outline.

21. A method for fabricating solder bumps according to claim 1, wherein the step of filling said cavities of the solder ball forming member with a solder paste comprises applying a solder paste to the flat surface of the solder ball forming member and moving a squeegee along the flat surface of the solder ball forming member.

22. A method for fabricating solder bumps according to claim 1, wherein said solder ball forming member is made from a silicon plate and the cavities are formed in the flat surface by anisotropic etching.

23. A method for fabricating solder bumps according to claim 1, wherein said solder ball forming member is made from a silicon plate arranged such that the flat surface is in the <100> crystallographic plane of the silicon and the cavities are formed in the flat surface by anisotropic etching.

24. A method for fabricating solder bumps according to claim 23, wherein the cavity of the solder ball forming member has a square outline.

25. A method for fabricating solder bumps according to claim 1, further including the step of slidably moving a knife edge on the flat surface of the solder ball forming member in a direction at an obtuse angle between the knife edge and the flat surface of the solder ball forming member for peeling the solder paste remaining on the flat surface of the solder ball forming member, after the step of filling said cavities and before the step of heating the solder ball forming member.

26. A method for fabricating solder bumps according to claim 25, wherein the step of filling said cavities of the solder ball forming member with a solder paste comprises applying a solder paste to the flat surface of the solder ball forming member and moving a squeegee along the flat surface of the solder ball forming member, and wherein in the step of moving the squeegee, the solder ball forming member is supported by support means having a first support surface for supporting the solder ball forming member thereon and a second support surface which is substantially flush with the flat surface of the solder ball forming member when the solder ball forming member is supported on the first support surface, and the squeegee is slidably moved continuously from the second support surface to the flat surface of the solder ball forming member.

27. A method for fabricating solder bumps according to claim 26, wherein in the step of moving the squeegee, the squeegee is arranged at an angle relative to the solder ball forming member, when viewed from above.

28. A method for fabricating solder balls according to claim 1, further including the step of slidably moving a knife edge on the flat surface of the solder ball forming member in a direction at an obtuse angle between the knife edge and the flat surface of the solder ball forming member for peeling the solder paste remaining on the flat surface of the solder ball forming member, after the step of filling said cavities and before the step of heating the solder ball forming member.

29. A method for fabricating solder balls according to claim 28, wherein the step of filling said cavities of the solder ball forming member with a solder paste comprise applying a solder paste to the flat surface of the solder ball forming member and moving a squeegee along the flat surface of the solder ball forming member, and wherein in the step of moving the squeegee, the solder ball forming member is supported by support means having first support surface for supporting the solder ball forming member thereon and a second support surface which is substantially flush with the flat surface of the solder ball forming member when the solder ball forming member is supported on the first support surface, and the squeegee is slidably moved continuously from the second support surface to the flat surface of the solder ball forming member.

30. A method for fabricating solder bumps according to claim 29, wherein in the step of moving the squeegee, the squeegee is arranged at an angle relative to the solder ball forming member, when viewed from above.

31. A method for fabricating solder bumps according to claim 1, wherein at least one of the cavities has a pyramidal bottom.

32. A method for fabricating solder bumps according to claim 1, wherein each of the cavities has a deepest portion arranged such that a solder ball can be positioned in the cavity above said deepest portion without contacting said deepest portion.

33. A method for fabricating solder bumps, said method comprising the steps of:

preparing a solder ball forming member having a flat surface and a plurality of cavities arranged on said flat surface in a pattern;

filling said cavities with a solder paste including solder powder and a flux;

heating said solder ball forming member to cause the solder powder contained in the solder paste in each of said cavities to melt and to form solder balls due to surface tension;

moving a first member onto which solder bumps are to be formed toward the solder ball forming member to transfer the heated solder balls from the solder ball forming member to the first member, wherein at least one of the cavities has a deepest point at a central position, and wherein the profile of the at least one of the cavities becomes smaller as the depth increases; and slidably moving a knife edge on the flat surface of the solder ball forming member in a direction at an obtuse angle between the knife edge and the flat surface of the solder ball forming member for peeling the solder paste remaining on the flat surface of the solder ball forming member, after the step of filling said cavities and before the step of heating the solder ball forming member.

34. A method for fabricating solder bumps, said method comprising the steps of:

preparing a solder ball forming member having a flat surface and a plurality of cavities arranged on said flat surface in a pattern:

filling said cavities with a solder paste including solder powder and a flux;

heating said solder ball forming member to cause the solder powder contained in the solder paste in each of said cavities to melt and to form solder balls due to surface tension;

moving a first member, onto which solder bumps are to be formed, toward said solder ball forming member having said solder balls at a temperature lower than a melting point; and heating said solder balls to a temperature higher than the melting point to transfer said solder balls from said solder ball forming member to said first member, while maintaining said solder ball forming member in abutment with said first member.

35. A method for fabricating solder bumps, said method comprising the steps of:

preparing a solder ball forming member having a flat surface and a plurality of cavities arranged on said flat surface in a pattern by etching in such a manner that each of the cavities has at least two inclined bottom surfaces and a deepest portion at a juncture of said at least two inclined bottom surfaces, and the profile of at least one of the cavities becomes smaller as the depth increases;

filling said cavities with a solder paste including solder powder and a flux;

heating said solder ball forming member to cause the solder powder contained in the solder paste in each of said cavities to melt and to form solder balls due to surface tension; and moving a first member onto which solder bumps are to be formed toward the solder ball forming member to transfer the heated solder balls from the solder ball forming member to the first member, wherein said method further comprises the step of cooling the solder ball forming member after the solder balls have formed and before the solder balls have been transferred to the first member, the step of heating including heating at least one of the solder ball forming member and the first member.

36. A method for fabricating solder bumps, said method comprising the steps of:

preparing a solder ball forming member having a flat surface and a plurality of cavities arranged on said flat surface in a pattern by etching in such a manner that each of the cavities has at least two inclined bottom surfaces and a deepest portion at a juncture of said at least two inclined bottom surfaces, and the profile of at least one of the cavities becomes smaller as the depth increases;

filling said cavities with a solder paste including solder powder and a flux;

heating said solder ball forming member to cause the solder powder contained in the solder paste in each of said cavities to melt and to form solder balls due to surface tension; and moving a first member onto which solder bumps are to be formed toward the solder ball forming member to transfer the heated solder balls from the solder ball forming member to the first member, wherein at least one of the cavities of the solder ball forming member has an outline at said flat surface, a bottom, and an annular side wall portion interconnecting the flat surface to the bottom, the solder ball forming member comprises first and second removably superposed plates, said first plate having a flat surface providing said flat surface of the solder ball forming member and through holes providing an annular side wall portion, said second plate forming said bottoms of the cavities of the solder ball forming, and wherein said solder ball transferring step comprises the steps of moving the second plate away from the first plate with the solder balls retained in the first plate, and moving the first member toward a second surface of the first plate opposite from said flat surface.

37. A method for fabricating solder bumps, said method comprising the steps of:

preparing a solder ball forming member having a flat surface and a plurality of cavities arranged on said flat surface in a pattern by etching in such a manner that each of the cavities has at least two inclined bottom surfaces and a deepest portion at a juncture of said at least two inclined bottom surfaces, and the profile of at least one of the cavities becomes smaller as the depth increases;

filling said cavities with a solder paste including solder powder and a flux;

heating said solder ball forming member to cause the solder powder contained in the solder paste in each of said cavities to melt and to form solder balls due to surface tension; and moving a first member onto which solder bumps are to be formed toward the solder ball forming member to transfer the heated solder balls from the solder ball forming member to the first member, wherein said method further comprises the step of slidably moving a knife edge on the flat surface of the solder ball forming member in a direction at an obtuse angle between the knife edge and the flat surface of the solder ball forming member for peeling the solder paste remaining on the flat surface of the solder ball forming member, after the step of filling said cavities and before the step of heating the solder ball forming member.

38. A method for fabricating solder bumps according to claim 36, wherein said solder ball transferring step further comprises pushing the solder balls retained in the first plate toward the first member.

39. A method for fabricating solder bumps according to claim 37, wherein the step of filling said cavities of the solder ball forming member with a solder paste comprises applying a solder paste to the flat surface of the solder ball forming member and moving a squeegee along the flat surface of the solder ball forming member, and wherein in the step of moving the squeegee, the solder ball forming member is supported by support means having a first support surface for supporting the solder ball forming member thereon and a second support surface which is substantially flush with the flat surface of the solder ball forming member when the solder ball forming member is supported on the first support surface, and the squeegee is slidably moved continuously from the second support surface to the flat surface of the solder ball forming member.

40. A method for fabricating solder bumps according to claim 39, wherein in the step of moving the squeegee, the squeegee is arranged at an angle relative to the solder ball forming member, when viewed from above.

41. A method for fabricating solder bumps according to claim 1, wherein each of the cavities has a quadrangular pyramidal shape.

* * * * *